United States Patent [19]
Anthony

[11] Patent Number: 6,018,448
[45] Date of Patent: *Jan. 25, 2000

[54] PAIRED MULTI-LAYERED DIELECTRIC INDEPENDENT PASSIVE COMPONENT ARCHITECTURE RESULTING IN DIFFERENTIAL AND COMMON MODE FILTERING WITH SURGE PROTECTION IN ONE INTEGRATED PACKAGE

[75] Inventor: Anthony A. Anthony, Erie, Pa.

[73] Assignee: X2Y Attenuators, L.L.C., Santa Monica, Calif.

[ * ] Notice: This patent is subject to a terminal disclaimer.

[21] Appl. No.: 09/056,379

[22] Filed: Apr. 7, 1998

Related U.S. Application Data

[63] Continuation-in-part of application No. 09/008,769, Jan. 19, 1998, which is a continuation-in-part of application No. 08/841,940, Apr. 8, 1997.

[51] Int. Cl.[7] .................................................. H02H 1/00
[52] U.S. Cl. ............................. 361/56; 361/111; 361/113; 361/118
[58] Field of Search ................................. 361/56, 58, 91, 361/111, 113, 117, 118, 119, 127, 302

[56] References Cited

U.S. PATENT DOCUMENTS

| | | | |
|---|---|---|---|
| 3,842,374 | 10/1974 | Schlicke | 333/79 |
| 4,262,317 | 4/1981 | Baumbach | 361/124 |
| 4,335,417 | 6/1982 | Sakshaug et al. | 361/127 |
| 4,587,589 | 5/1986 | Marek | 361/56 |
| 4,682,129 | 7/1987 | Bakermans et al. | 333/184 |
| 4,772,225 | 9/1988 | Ulery | 939/620 |
| 5,079,069 | 1/1992 | Howard et al. | 428/209 |
| 5,142,430 | 8/1992 | Anthony | 361/56 |
| 5,155,655 | 10/1992 | Howard et al. | 361/303 |
| 5,161,086 | 11/1992 | Howard et al. | 361/321 |
| 5,181,859 | 1/1993 | Foreman et al. | 439/225 |
| 5,236,376 | 8/1993 | Cohen | 439/620 |
| 5,243,308 | 9/1993 | Shusterman et al. | 333/181 |
| 5,251,092 | 10/1993 | Brady et al. | 361/36 |
| 5,261,153 | 11/1993 | Lucas | 29/830 |
| 5,268,810 | 12/1993 | DiMarco et al. | 361/111 |
| 5,290,191 | 3/1994 | Foreman et al. | 439/225 |
| 5,321,373 | 6/1994 | Shusterman et al. | 333/12 |
| 5,321,573 | 6/1994 | Person et al. | 361/56 |
| 5,337,028 | 8/1994 | White | 333/181 |
| 5,353,189 | 10/1994 | Tomlinson | 361/118 |
| 5,414,587 | 5/1995 | Kiser et al. | 361/118 |
| 5,455,734 | 10/1995 | Foreman et al. | 361/118 |
| 5,483,407 | 1/1996 | Anastasio et al. | 361/56 |
| 5,500,629 | 3/1996 | Meyer | 333/181 |
| 5,512,196 | 4/1996 | Mantese et al. | 252/62.9 |
| 5,555,150 | 9/1996 | Newman et al. | 361/56 |
| 5,568,348 | 10/1996 | Foreman et al. | 361/118 |
| 5,752,539 | 5/1998 | Stevenson et al. | 361/302 |
| 5,838,216 | 11/1998 | White et al. | 333/182 |
| 5,909,350 | 6/1999 | Anthony | 361/118 |

OTHER PUBLICATIONS

PCT International Search Report for International Application No. PCT/US/98/06962 Aug. 19, 1998.

PCT International Search Report for International Applciation No. PCT/US99/07653 mailed Jul. 19, 1999 assigned to X2Y Attenuators, LLC in which the referenced patents were cited.

*Primary Examiner*—Stephen W Jackson
*Attorney, Agent, or Firm*—Oldham & Oldham Co., L.P.A.

[57] ABSTRACT

The present invention relates to a passive electronic component architecture employed in conjunction with various dielectric and combinations of dielectric materials to provide one or more differential and common mode filters for the suppression of electromagnetic emissions and surge protection. The architecture allows single or multiple components to be assembled within a single package such as an integrated circuit or connector. The component's architecture is dielectric independent and provides for integration of various electrical characteristics within a single component to perform the functions of filtering, decoupling, fusing and surge suppression, alone or in combination.

44 Claims, 21 Drawing Sheets

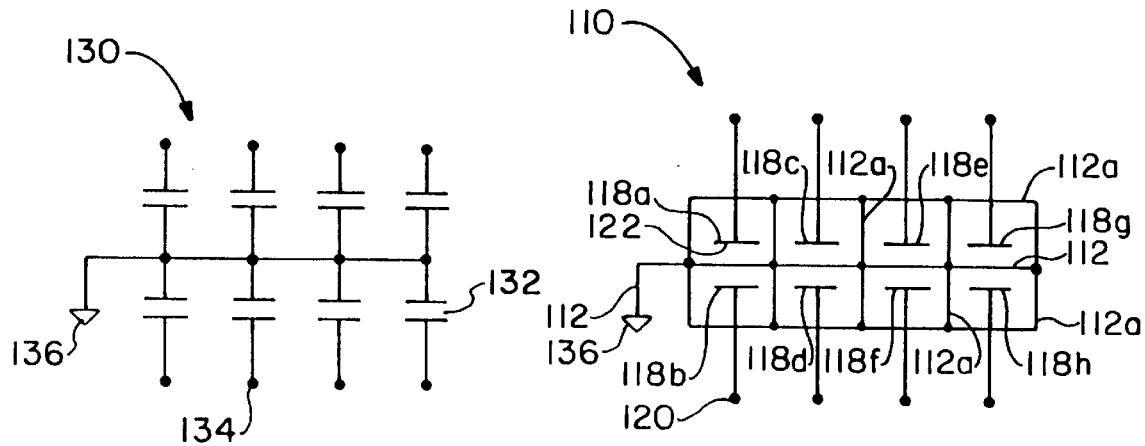
FIG.-5A
FIG.-5B
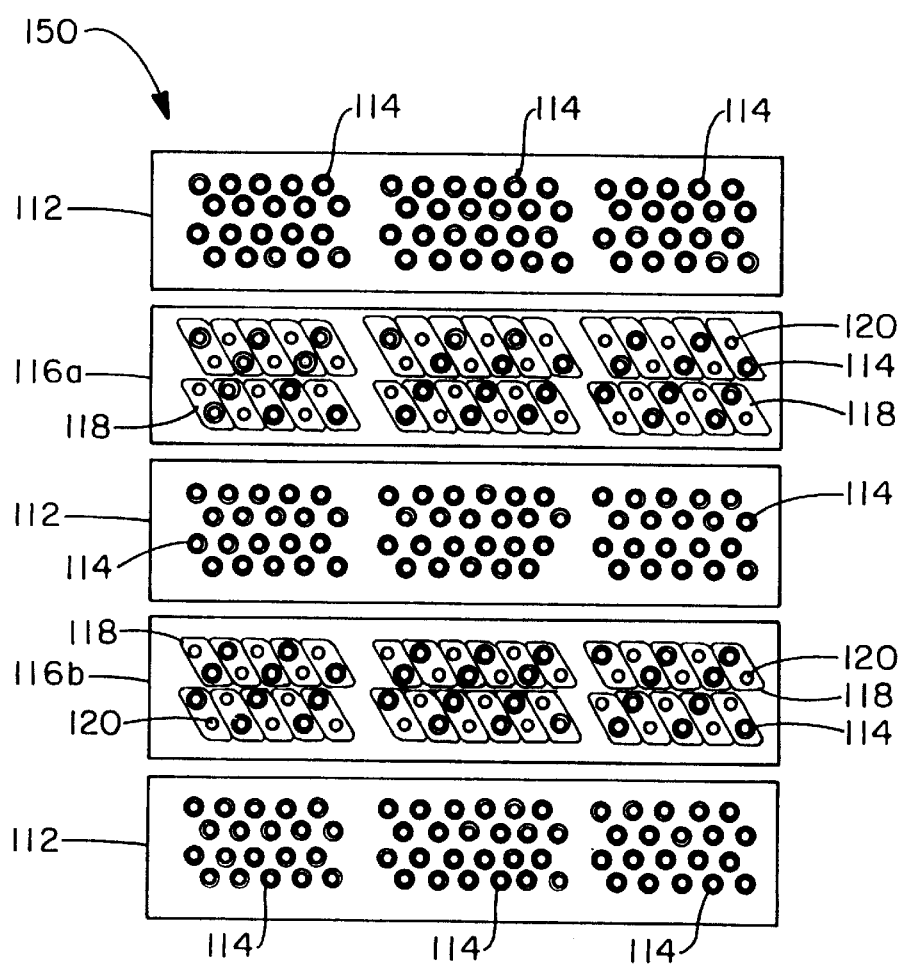
FIG.-6

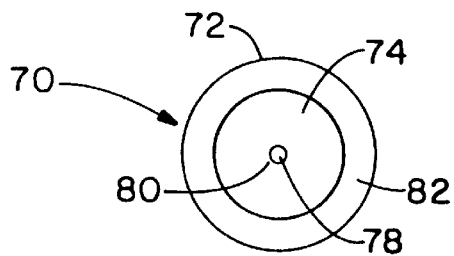
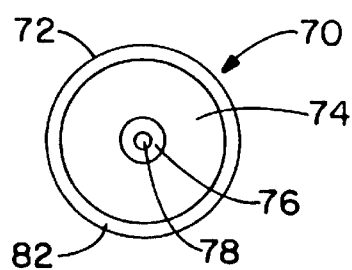
FIG.-7A          FIG.-7B
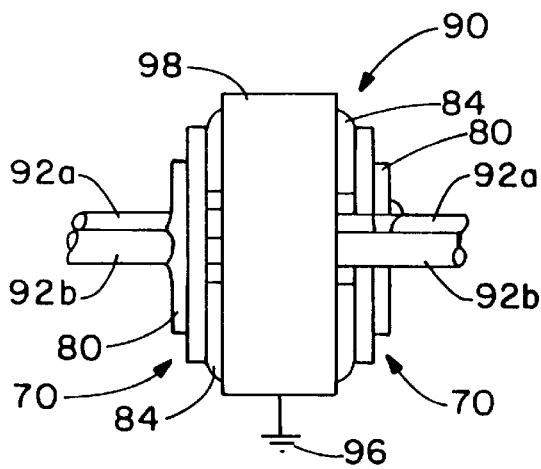
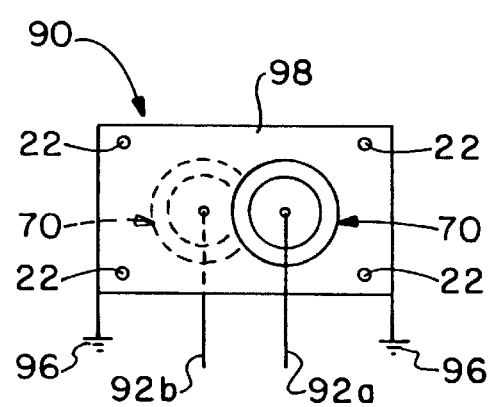
FIG.-8          FIG.-9
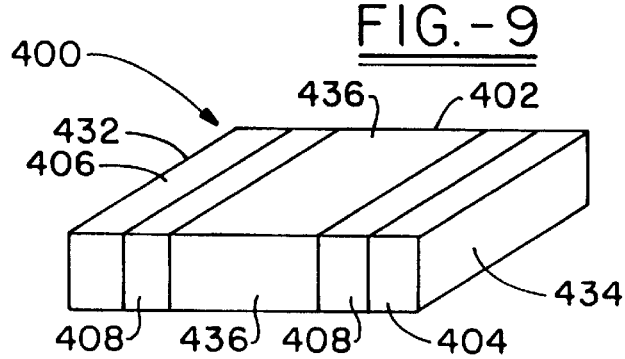
FIG.-10A
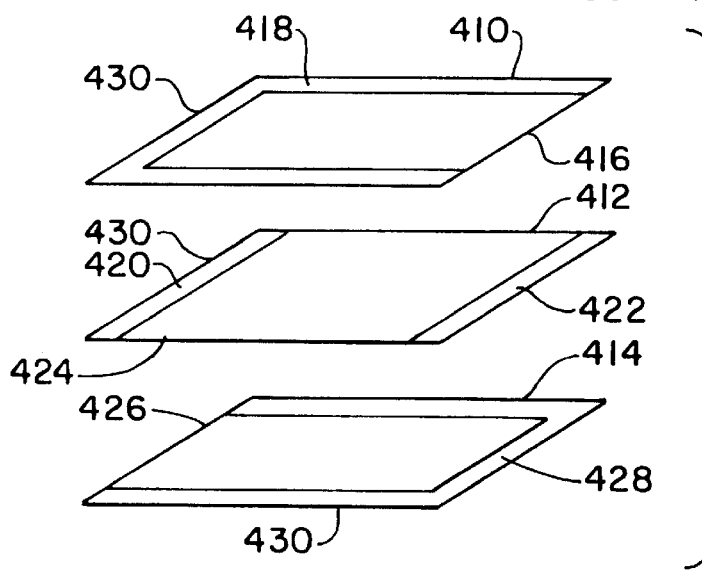
FIG.-10B

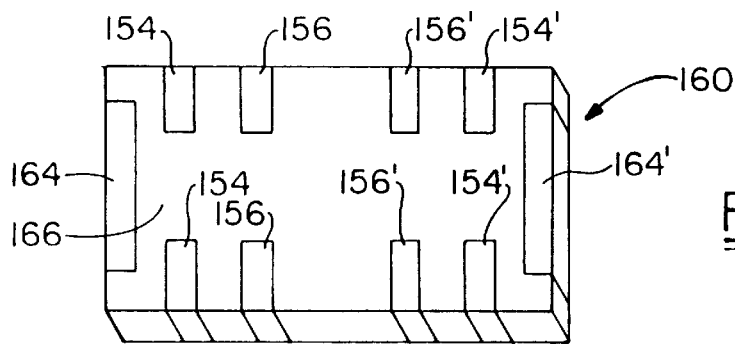
FIG.-12A
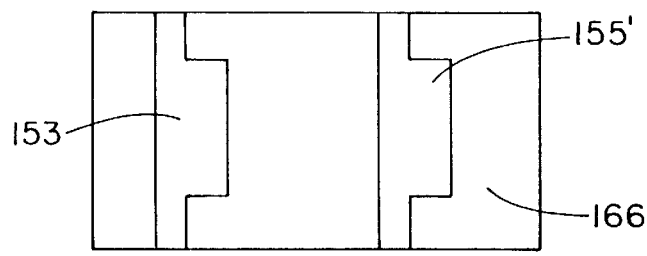
FIG.-12B
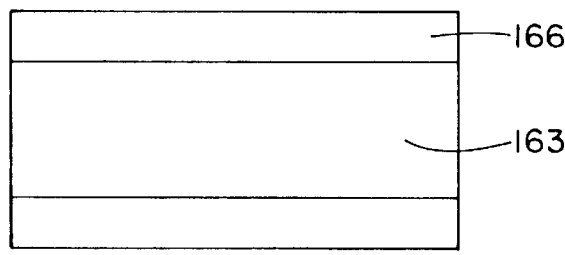
FIG.-12C
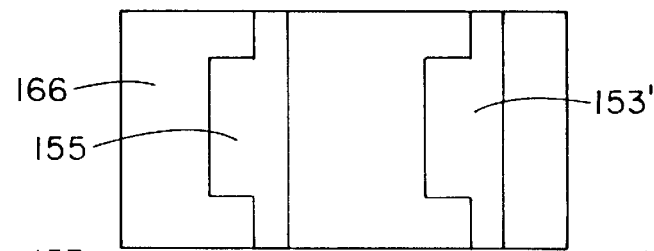
FIG.-12D
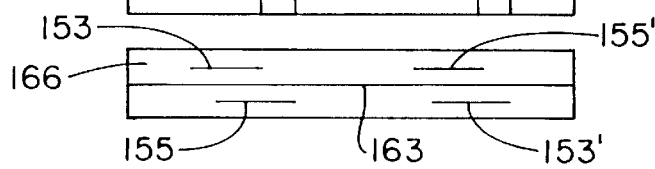
FIG.-12E
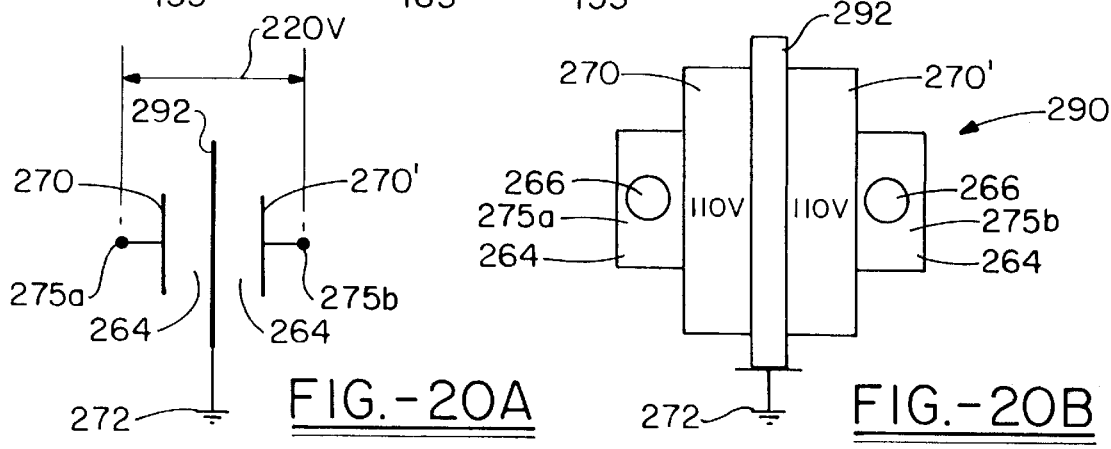
FIG.-20A  FIG.-20B

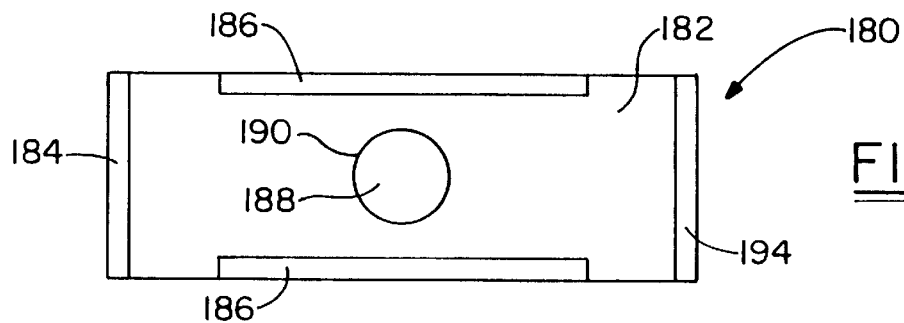
FIG.-16A
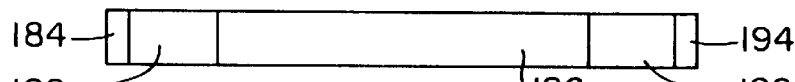
FIG.-16B
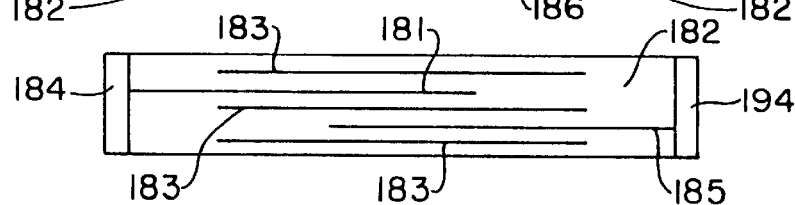
FIG.-16C
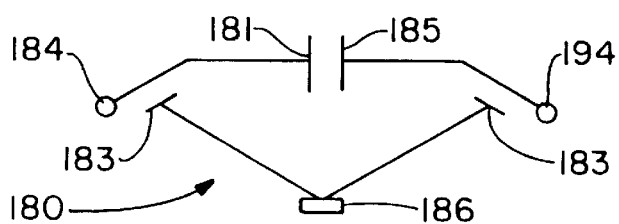
FIG.-16D
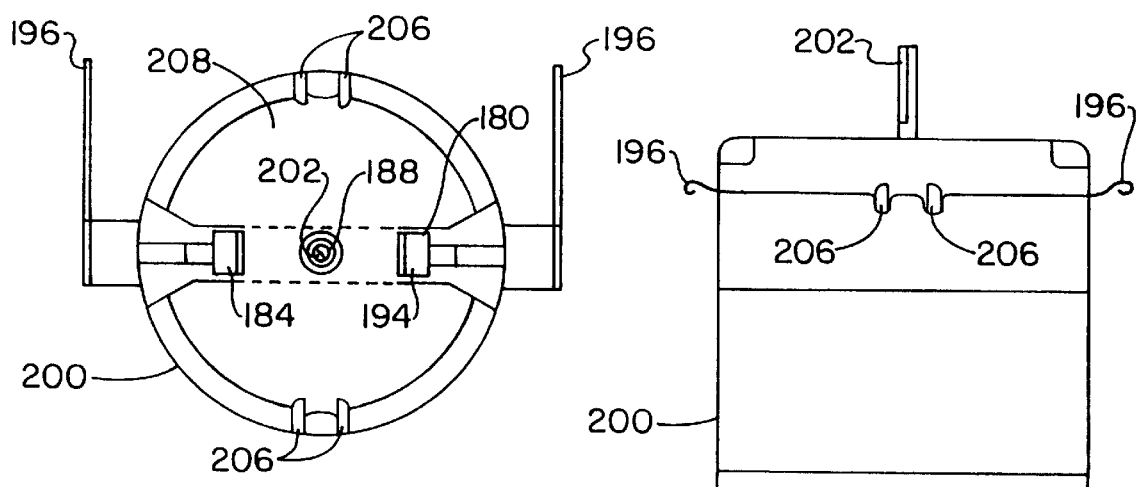
FIG.-17A
FIG.-17B

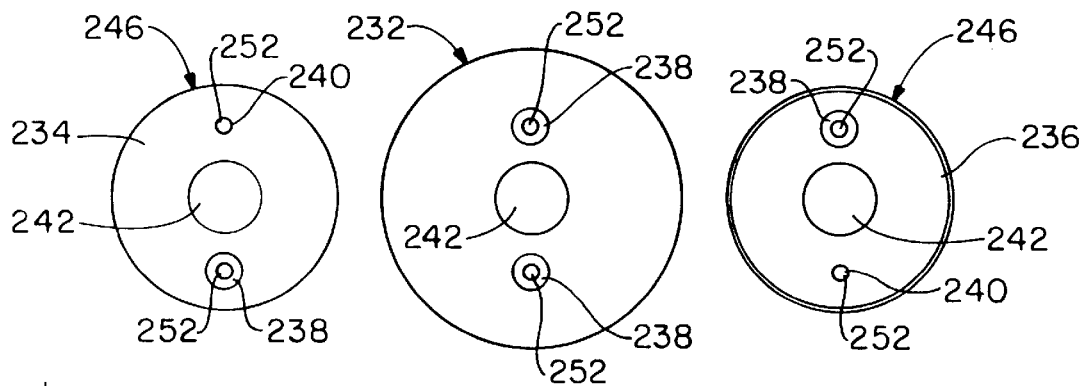
FIG.-19A
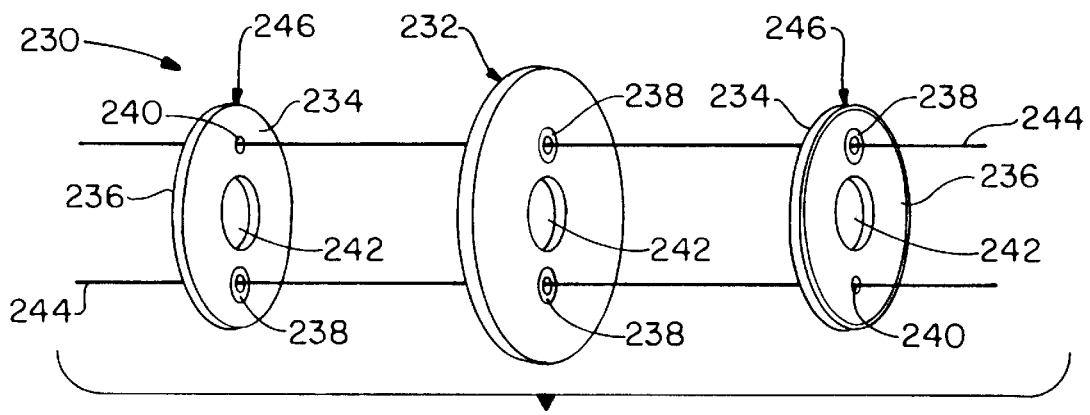
FIG.-19B
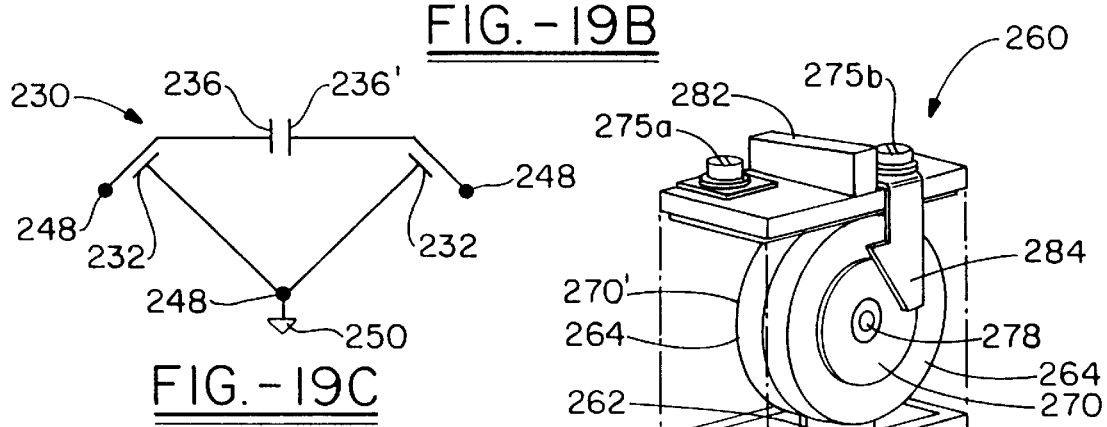
FIG.-19C
FIG.-21A
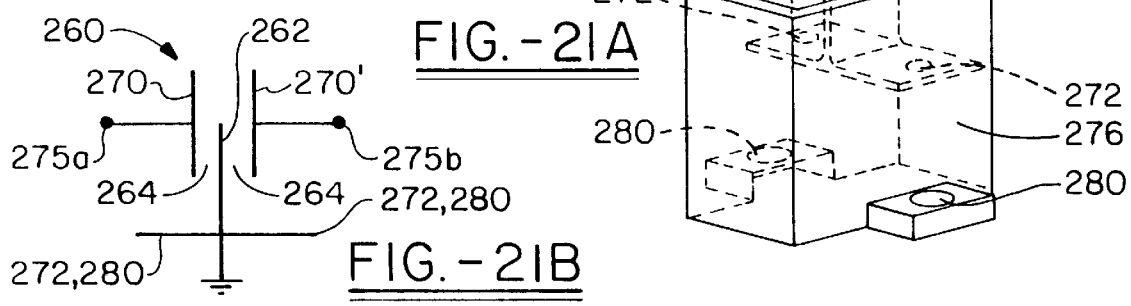
FIG.-21B

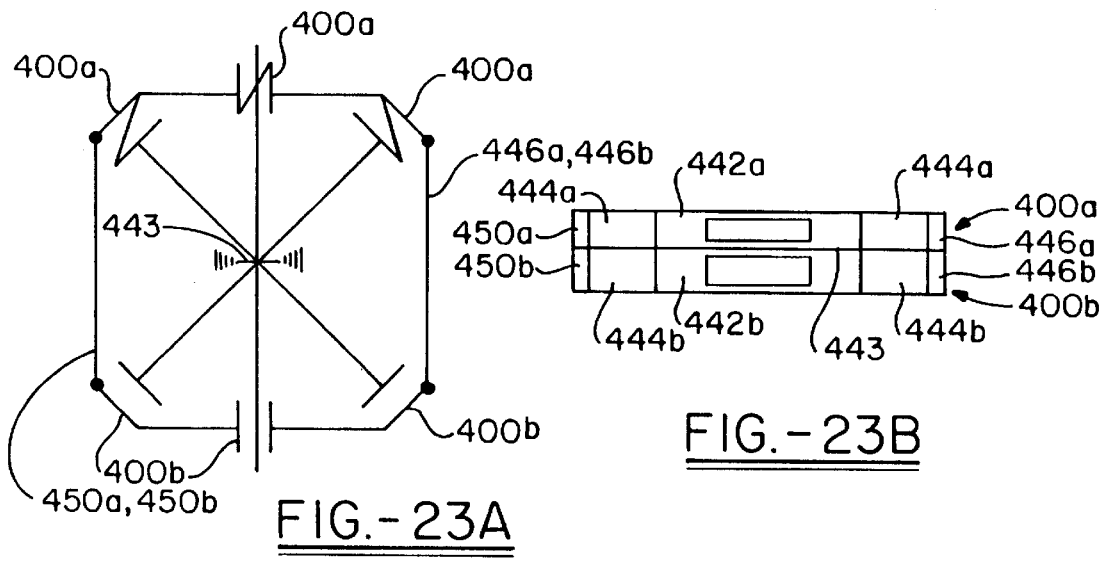
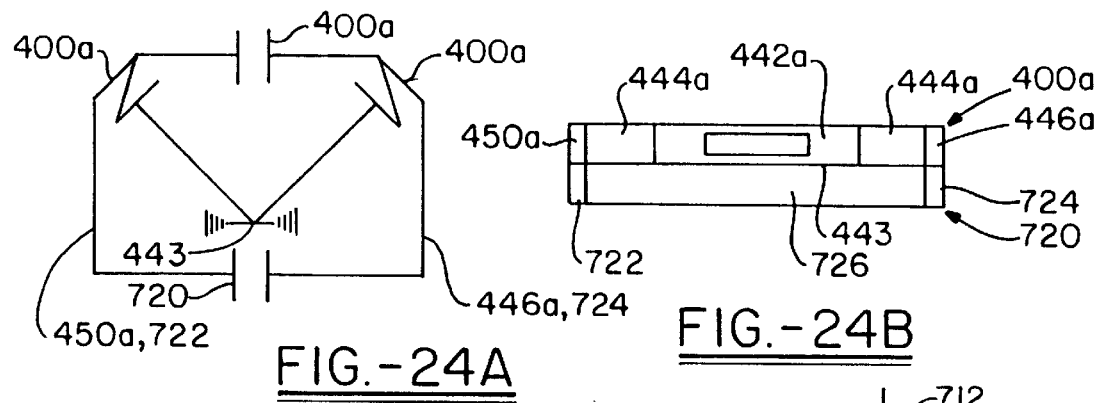
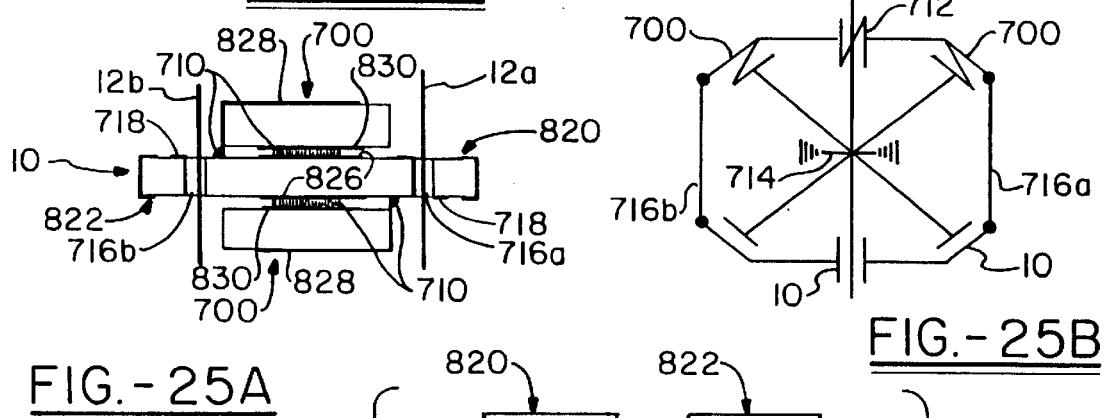

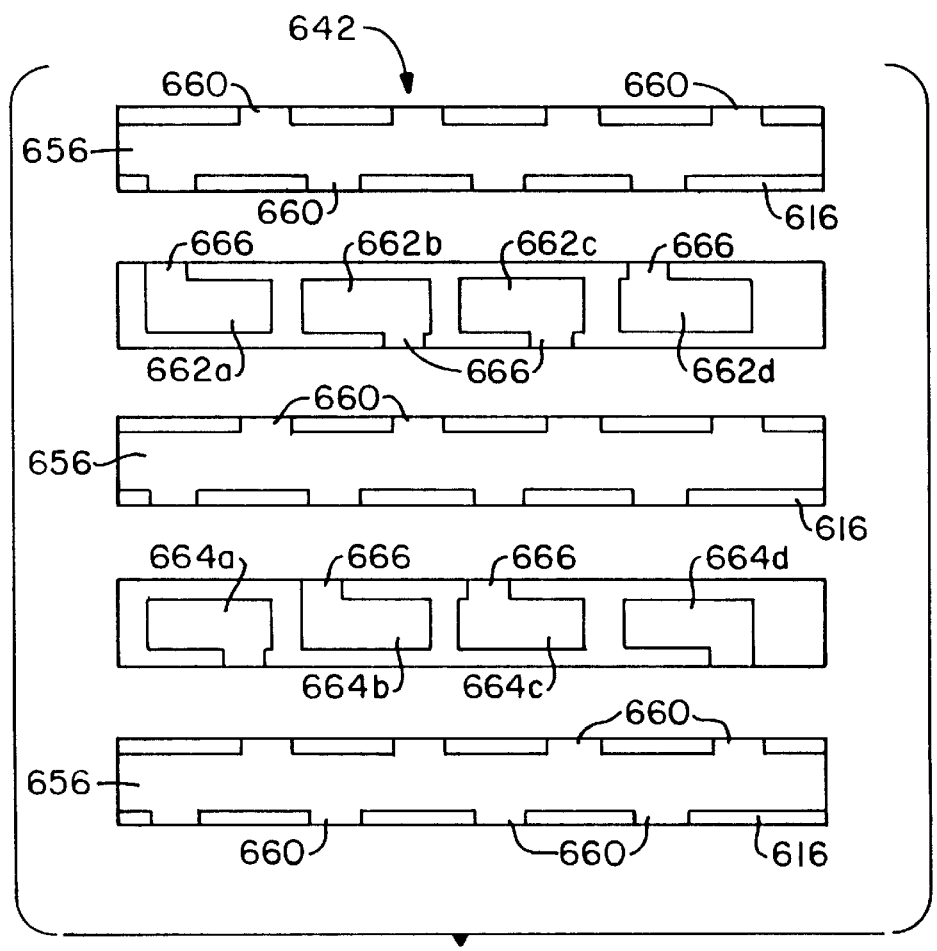
FIG.-29
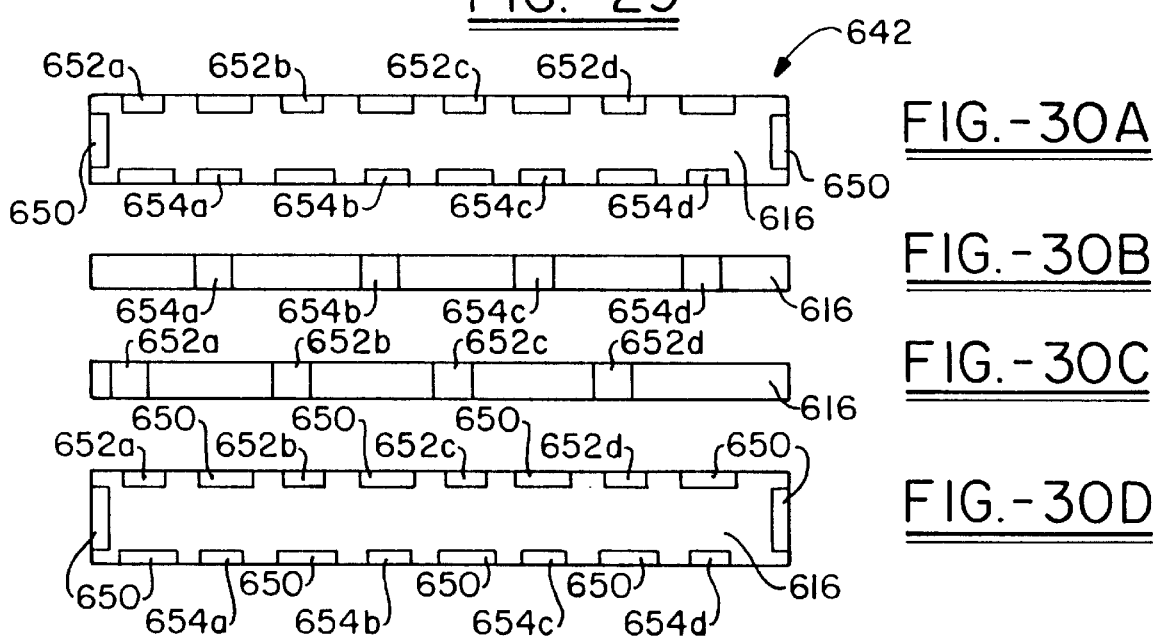
FIG.-30A
FIG.-30B
FIG.-30C
FIG.-30D

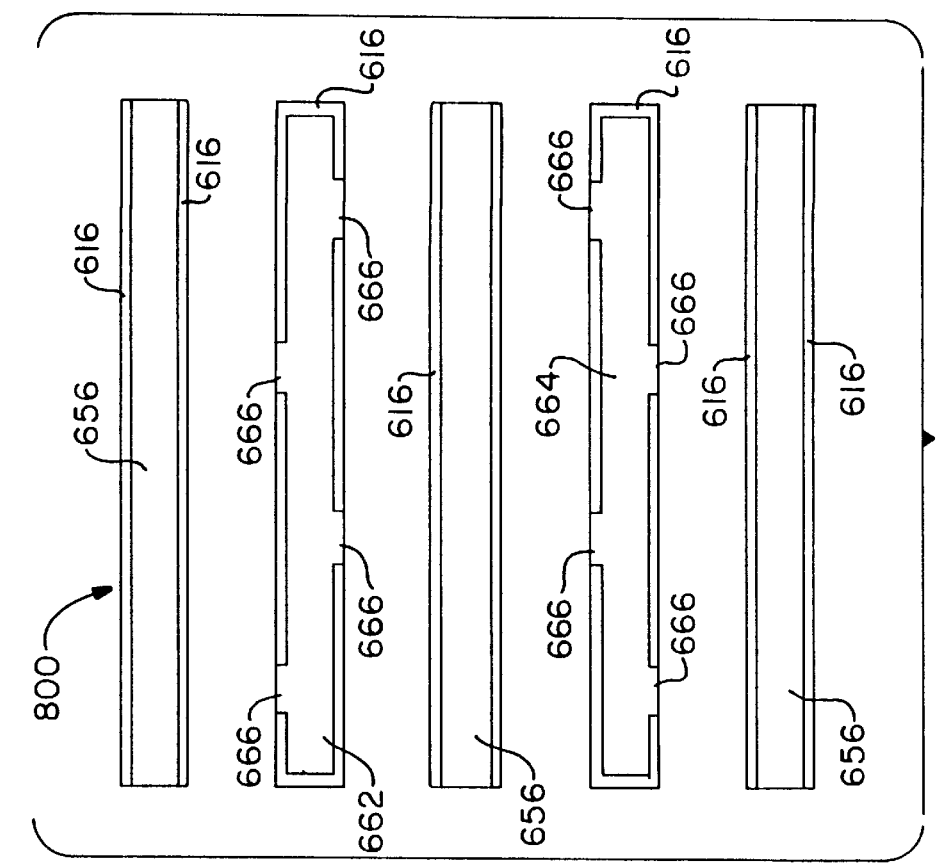
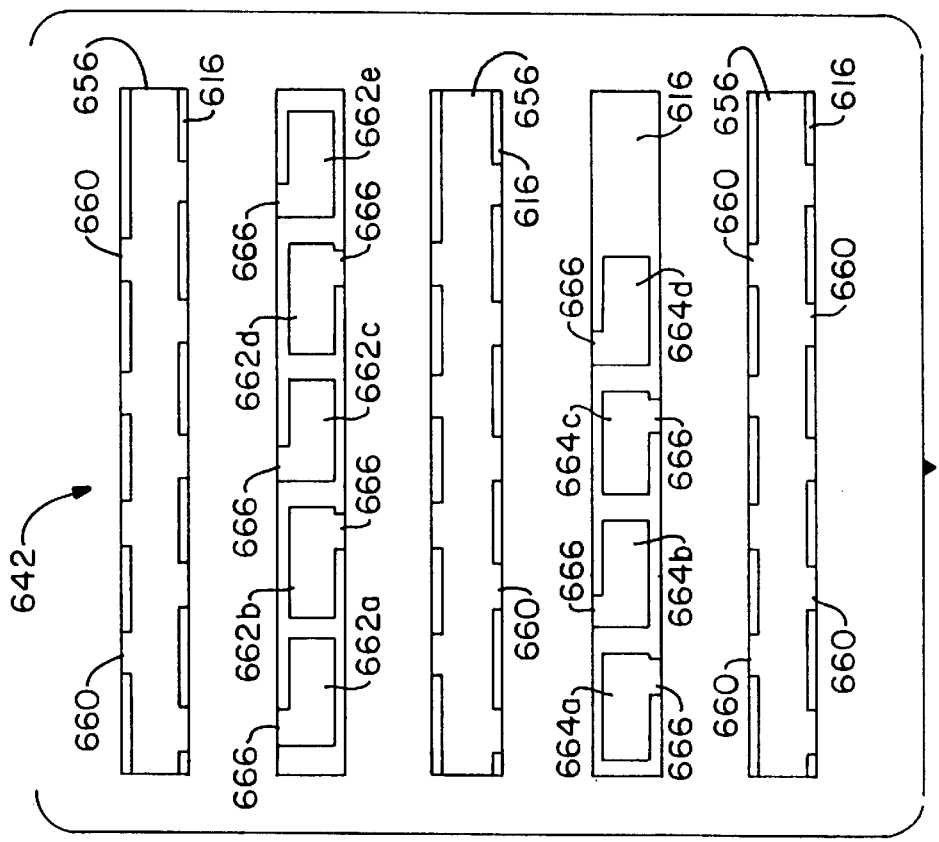

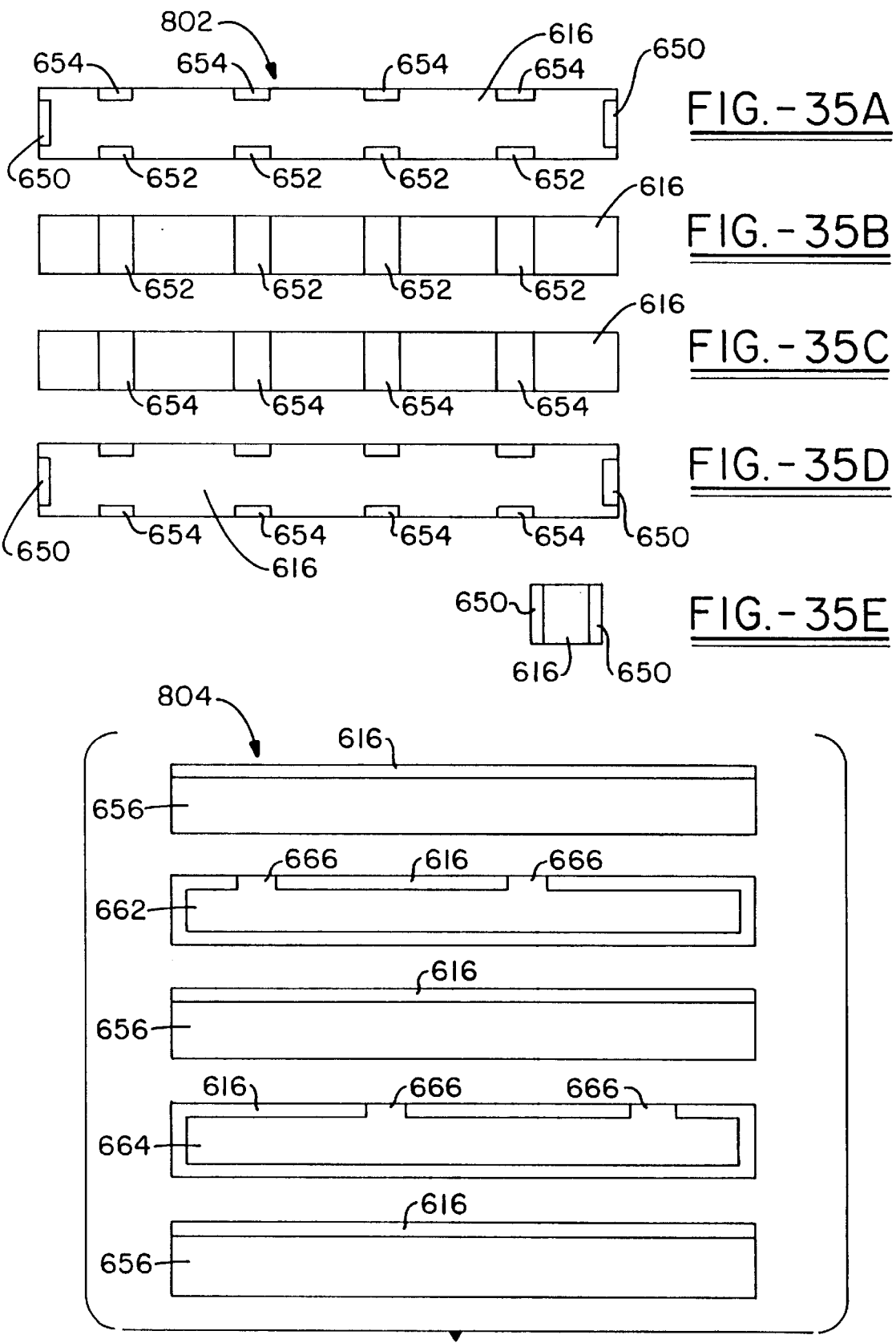

PAIRED MULTI-LAYERED DIELECTRIC INDEPENDENT PASSIVE COMPONENT ARCHITECTURE RESULTING IN DIFFERENTIAL AND COMMON MODE FILTERING WITH SURGE PROTECTION IN ONE INTEGRATED PACKAGE

TECHNICAL FIELD

This application is a continuation-in-part of application Ser. No. 09/008,769 filed Jan. 19, 1998 which is a continuation-in-part of application Ser. No. 08/841,940 filed Apr. 8, 1997. The present invention relates to a filter for protecting electronic circuitry from electromagnetic field interference (EMI), over voltages and preventing electromagnetic emissions. More specifically, this invention relates to a multi-functional electronic component whose physical architecture suppresses unwanted electromagnetic emissions, both those received from other sources and those created internally within electronic circuitry by differential and common mode currents. In addition, due to the electronic component's physical architecture and material composition, over voltage surge protection and magnetic properties can be integrally incorporated with the differential and common mode filtering.

BACKGROUND OF THE INVENTION

The majority of electronic equipment produced presently, and in particular computers, communication systems, automobiles, military surveillance equipment, stereo and home entertainment equipment, televisions and other appliances include miniaturized components to perform new high speed functions and electrical interconnections which according to the materials from which they are made or their mere size are very susceptible to stray electrical energy created by electromagnetic interference or voltage transients occurring on electrical lines. Voltage transients can severely damage or destroy such micro-electronic components or contacts thereby rendering the electronic equipment inoperative, and requiring extensive repair and/or replacement at great cost.

Electrical interference in the form of EMI or RFI can be induced into electrical lines from such sources as radio broadcast antennas or other electromagnetic wave generators. EMI can also be generated from the electrical circuit which is desired to be shielded from EMI. Differential and common mode currents are typically generated in cables and on circuit board tracks. In many cases fields radiate from these conductors which act as antennas. Controlling these conducted/radiated emissions is necessary to prevent interference with other circuitry or other parts of the circuit generating or sensitive to the unwanted noise. Other sources of interference are generated from equipment coupled to the electrical lines, such as computers, switching power supplies and a variety of other systems, which may generate significant interference which is desired to be eliminated to meet international emission and/or susceptibility requirements.

Transient voltages occurring on electrical lines can be induced by lightning which produces extremely large potentials in a very short time. In a similar manner, nuclear electromagnetic pulses (EMP) generate even larger voltage spikes with faster rise time pulses over a broad frequency range which are detrimental to most electronic devices. Other sources of large voltage transients are found to be associated with voltage surges occurring upon the switching off or on of some electronic power equipment as well as ground loop interference caused by varying ground potentials. Existing protection devices, primarily due to their architecture and basic materials, do not provide adequate protection in a single integrated package.

Based upon the known phenomenon of electromagnetic emissions and transient voltage surges a variety of filter and surge suppression circuit configurations have been designed as is evident from the prior art. A detailed description of the various inventions in the prior art is disclosed in U.S. Pat. No. 5,142,430, herein incorporated by reference.

The '430 patent itself is directed to power line filter and surge protection circuit components and the circuits in which they are used to form a protective device for electrical equipment. The circuit components comprise wafers or disks of material having desired electrical properties such as varistor or capacitor characteristics. The disks are provided with electrode patterns and insulating bands on surfaces thereof which coact with apertures formed therein so as to electrically connect the components to electrical conductors of a system easily and effectively. These electrode patterns act in conjunction with one another to form common electrodes with the material interposed there between. The '430 patent was primarily directed toward filtering paired lines. The present invention improves on the paired line concept by refining and adapting the concept for use with low voltage low current data communication lines as well as arrangements directed towards high voltage industrial and home applications such as three phase power lines, electric motor noise filtering, LANs and other computer and electronic devices.

Therefore, in light of the foregoing deficiencies in the prior art, the applicant's invention is herein presented.

SUMMARY OF THE INVENTION

Based upon the foregoing, there has been found a need to provide a multi-functioning electronic component which attenuates electromagnetic emissions resulting from differential and common mode currents flowing within electronic circuits, single lines, pairs of lines and multiple twisted pairs. Because of the sensitive nature of electronic technology there is also a need for combining electromagnetic filtering with surge protection to eliminate the susceptibility to over voltages and emissions from external sources. Due to the highly competitive nature of today's electronic industry such a differential and common mode filter/surge protector must be inexpensive, miniaturized, low in cost and highly integrated to be incorporated into a plurality of electronic products.

It is therefore a main object of the invention to provide an easily manufactured and adaptable multi-functional electronic component which filters electromagnetic emissions caused by differential and common mode currents.

It is another object of the invention to provide a protective circuit arrangement which may be mass produced and adaptable to include one or more protective circuits in one component package to provide protection against voltage transients, over voltages and electromagnetic interference.

Another object of the invention is to provide protective circuits having an inherent ground which provides a path for attenuating EMI and over voltages without having to couple the hybrid electronic component to circuit or earth ground.

These and other objects and advantages of the invention are accomplished through the use of a plurality of common ground conductive plates surrounding corresponding electrode plates separated by a material which exhibits any one or a combination of a number of predetermined electrical properties. By coupling pairs of conductors to the plurality of common ground conductive plates and selectively coupling the conductors to electrode plates, line-to-line and line-to-ground component coupling is accomplished providing differential and common mode electromagnetic interference filtering and/or surge protection. The circuit arrangement comprises at least one line conditioning circuit component constructed as a plate. Electrode patterns are provided on one surface of the plate and the electrode surfaces are then electrically coupled to electrical conductors of the circuit. The electrode patterns, dielectric material employed and common ground conductive plates produce commonality between electrodes for the electrical conductors which produces a balanced (equal but opposite) circuit arrangement with an electrical component coupled line-to-line between the electrical conductors and line-to-ground from the individual electrical conductors.

The particular electrical effects of the differential and common mode filter are determined by the choice of material between the electrode plates and the use of ground shields which effectively house the electrode plates within one or more Faraday cages. If one specific dielectric material is chosen the resulting filter will be primarily a capacitive arrangement. The dielectric material in conjunction with the electrode plates and common ground conductive plates will combine to create a line-to-line capacitor and a line-to-ground capacitor from each individual electrical conductor. If a metal oxide varistor (MOV) material is used then the filter will be a capacitive filter with over current and surge protection characteristics provided by the MOV-type material. The common ground conductive plates and electrode plates will once again form line-to-line and line-to-ground capacitive plates providing differential and common mode filtering accept in the case of high transient voltage conditions. During these conditions the MOV-type varistor material, which is essentially a non-linear resistor used to suppress high voltage transients, will take effect to limit the voltage which may appear between the electrical conductors.

In a further embodiment a ferrite material may be used adding additional inherent inductance to the differential and common mode filter arrangement. As before, the common ground conductive and electrode plates form line-to-line and line-to-ground capacitive plates with the ferrite material adding inductance to the arrangement. Use of the ferrite material also provides transient voltage protection in that it to will become conductive at a certain voltage threshold allowing the excess transient voltage to be shunted to the common ground conductive plates, effectively limiting the voltage across the electrical conductors.

Numerous other arrangements and configurations are also disclosed which implement and build on the above objects and advantages of the invention to demonstrate the versatility and wide spread application of differential and common mode filters within the scope of the present invention.

BRIEF DESCRIPTION OF THE DRAWINGS

FIG. 5 shows schematic representations of the differential and common mode filter and prior art filters with FIG. 5a being a multi-capacitor component as found in the prior art and FIG. 5b being the electrical representation of the physical embodiment of the differential and common mode filter of FIG. 4;

FIG. 6 is a top plan view of the plurality of common ground conductive and electrode plates which make up a high density multi-conductor differential and common filter embodiment;

FIG. 7 is a front elevational view of an electrode plate where FIG. 7a and FIG. 7b are the front and back, respectfully, of the electrode plate;

FIG. 8 shows a side elevational view of an alternative embodiment of the differential and common mode filter of FIG. 1 which employs the electrode plates of FIG. 7;

FIG. 9 shows a front elevational view of the filter of FIG. 8;

FIG. 10 shows a surface mount chip embodiment of a differential and common mode filter with FIG. 10a being a perspective view and FIG. 10b showing an exploded perspective view of the same;

FIG. 12 shows a multi-filter surface mount component with FIG. 12a being a top plan view of the filter; FIGS. 12b through 12d shows top plan views of internal electrode layers; and FIG. 12e shows a front elevational view in cross section of the filter shown in FIG. 12a;

FIG. 13 is not included;

FIG. 16 shows a further alternative embodiment of the differential and common mode filter configured primarily for use with electric motors; FIG. 16a shows a top plan view of the motor filter embodiment; FIG. 16b shows a side elevational view of the same; FIG. 16c shows a side elevational view in cross-section of the same; and FIG. 16d is an electrical representation of the physical embodiment of the filter shown in FIG. 16a;

FIG. 17 shows the motor differential and common mode filter embodiment electrically and physically coupled to an electric motor; FIG. 17a shows a top plan view of the filter coupled to a motor and FIG. 17b shows a side elevational view of the same;

FIG. 19 shows a further alternate embodiment of the motor differential and common mode filter: FIG. 19a shows a top plan view of the plurality of electrode plates; FIG. 19b shows an exploded perspective view of the electrode plates electrically coupled to a plurality of electrical conductors; and FIG. 19c is an electrical representation of the physical embodiment of the motor differential and common mode filter;

FIG. 20 shows a high power embodiment of the differential and common mode filter with FIG. 20a being a schematic representation of the filter and FIG. 20b being a partial schematic/block diagram of the same;

FIG. 21 shows a high power differential and common mode filter with FIG. 21a being a partially assembled perspective view and FIG. 21b being a schematic representation of the same;

FIG. 22 shows a further alternate embodiment of the present invention; FIG. 22b is a front elevational view of the filter shown in FIG. 22a; FIG. 22c is an electrical representation of the physical embodiment of the filter shown in FIG. 22a; and FIG. 22d is an alternate electrical representation of the physical embodiment of the filter shown in FIG. 22a;

FIG. 23 discloses one application of the filters of the present invention with FIG. 23a being an electrical representation of the physical embodiment of independent surge and electromagnetic interference (EMI) devices in combination as shown in FIG. 23b;

FIG. 24 discloses a further application of the filters of the present invention with FIG. 24a being an electrical representation of the physical embodiment of a surge protection device in combination with a capacitor as shown in FIG. 24b;

FIG. 25 discloses another application of the filters of the present invention with FIG. 25a being the physical embodiment of a differential and common mode thru-hole filter in combination with a plurality of surge protection devices and FIG. 25b being an electrical representation of the combination shown in FIG. 25a;

FIG. 26 is an elevational view of an alternate embodiment of an electrode plate where

FIG. 29 is an exploded view of the individual internal layers which makeup a multi-component strip filter wherein each internal layer shown is a bottom plan view of the layer;

FIG. 30 shows the multi-component strip filter shown in FIG. 29, where FIG. 30a is a top plan view, FIG. 30b is front side elevational view, FIG. 30c is a back side elevational view and FIG. 30d is a bottom plan view;

FIG. 31 is an exploded view of the individual internal layers which makeup an alternative multi-component strip filter wherein each internal layer shown is a bottom plan view of the layer;

FIG. 32 is an exploded view of the individual internal layers which makeup an alternative multi-component strip filter wherein each internal layer shown is a bottom plan view of the layer;

FIG. 33 shows the multi-component strip filter shown in FIG. 32, where

FIG. 35 shows the multi-component strip filter shown in FIG. 34, where FIG. 35a is a top plan view, FIG. 35b is front side elevational view, FIG. 35c is a back side elevational view, FIG. 35d is a bottom plan view and FIG. 35e is an end elevational view;

FIG. 36 is an exploded view of the individual internal layers which makeup an alternative multi-component strip filter wherein each internal layer shown is a bottom plan view of the layer;

FIG. 37 shows the multi-component strip filter shown in FIG. 36, where

FIG. 40 is an isometric view of the multi-component filter shown in FIG. 38 where

DETAILED DESCRIPTION OF THE PREFERRED EMBODIMENT

Due to the continued and increasing use of electronics in daily life and the amount of electromagnetic interference (EMI) and emissions generated, new world electromagnetic compatibility (EMC) requirements are being specified daily for use in such diverse applications as in the home, hospitals, automotive, aircraft and satellite industries. The present invention is directed towards a physical architecture for an electronic component which provides EMI suppression, broad band I/O-line filtering, EMI decoupling noise reduction and surge protection in one assembly.

To propagate electromagnetic energy two fields are required, an electric and magnetic. Electric fields couple energy into circuits through the voltage differential between two or more points. Magnetic fields couple energy into circuits through inductive coupling. Magnetic fields originate from currents flowing in a path which could simply consist of a loop of wire. In such loops both fields exist and are also included within circuit traces found on printed circuit boards. These fields start to diverge at frequencies above 1 MHz.

As previously noted, propagated electromagnetic energy is the cross product of both electric and magnetic fields. Typically, emphasis is placed on filtering EMI from circuit conductors carrying DC to high frequency noise. This can be explained for two reasons, the first being that a changing electric field in free space gives rise to a magnetic field and second because a time varying magnetic flux will give rise to an electric field. As a result a purely electric or magnetic time varying field cannot exist. Fields may be primarily electric or primarily magnetic but neither can be generated exclusively.

The main cause of radiated emission problems are due to the two types of conducted currents, differential and common mode. The fields generated by these currents result in EMI emissions. Differential mode (DM) currents are those currents which flow in a circular path in wires, circuit board traces and other conductors in a manner in which the field related to these currents originates from the loop defined by the conductors.

Common and differential mode currents differ in that they flow in different circuit paths. Common mode noise currents are surface phenomena relative to ground and, for example, travel on the outer skin of cables which are often grounded to the chassis. To reduce, minimize or suppress the noise it is necessary to provide a low impedance path to ground while simultaneously shortening the overall noise current loop.

Figure 1:
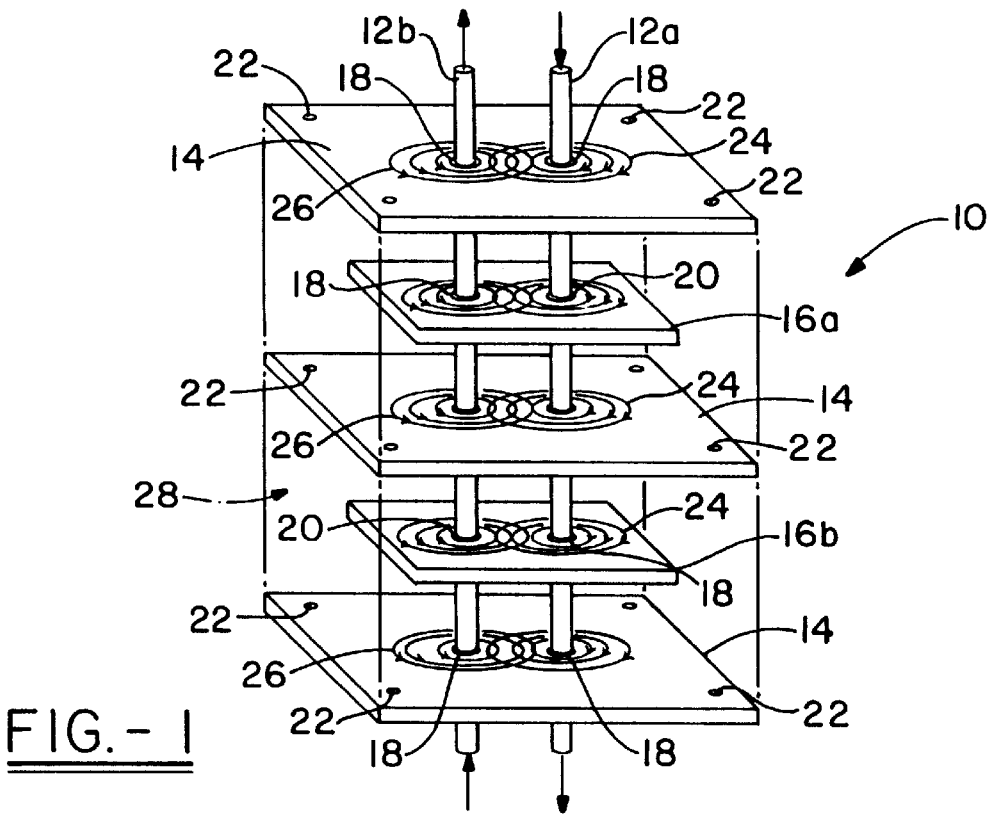
FIG. 1 shows an exploded perspective view of a differential and common mode filter in accordance with the present invention.

Turning now to FIG. 1, an exploded perspective view of differential and common mode filter 10's physical architecture is shown. Filter 10 is comprised of a plurality of common ground conductive plates 14 at least two electrode plates 16a and 16b where each electrode plate 16 is sandwiched between two common ground conductive plates 14. At least one pair of electrical conductors 12a and 12b is disposed through insulating apertures 18 or coupling apertures 20 of the plurality of common ground conductive plates 14 and electrode plates 16a and 16b with electrical conductors 12a and 12b also being selectively connected to coupling apertures 20 of electrode plates 16a and 16b. Common ground conductive plates 14 consist entirely of a conductive material such as metal in the preferred embodiment. At least one pair of insulating apertures 18 are disposed through each common ground conductive plate 14 to allow electrical conductors 12 to pass through while maintaining electrical isolation between common ground conductive plates 14 and electrical conductors 12. The plurality of common ground conductive plates 14 may optionally be equipped with fastening apertures 22 arranged in a predetermined and matching position to enable each of the plurality of common ground conductive plates 14 to be coupled securely to one another through standard fastening means such as screws and bolts. Fastening apertures 22 may also be used to secure differential and common mode filter 10 to another surface such as an enclosure or chassis of the electronic device filter 10 is being used in conjunction with.

Electrode plates 16a and 16b are similar to common ground conductive plates 14 in that they are comprised of a conductive material and have electrical conductors 12a and 12b disposed through apertures. Unlike common ground conductive plates 14, electrode plates 16a and 16b are selectively electrically connected to one of the two electrical conductors 12. While electrode plates 16, as shown in FIG. 1, are depicted as smaller than common ground conductive plates 14 this is not required but in this configuration has been done to prevent electrode plates 16 from interfering with the physical coupling means of fastening apertures 22.

Electrical conductors 12 provide a current path which flows in the direction indicated by the arrows positioned at either end of the electrical conductors 12 as shown in FIG. 1. Electrical conductor 12a represents an electrical signal conveyance path and electrical conductor 12b represents the signal return path. While only one pair of electrical conductors 12a and 12b is shown, Applicant contemplates differential and common mode filter 10 being configured to provide filtering for a plurality of pairs of electrical conductors creating a high density multi-conductor differential and common mode filter.

The final element which makes up differential and common mode filter 10 is material 28 which has one or a number of electrical properties and surrounds the center common ground conductive plate 14, both electrode plates 16a and 16b and the portions of electrical conductors 12a and 12b passing between the two outer common ground conductive plates 14 in a manner which completely isolates all of the plates and conductors from one another except for the connection created by the conductors 12a and 12b and coupling aperture 20. The electrical characteristics of differential and common mode filter 10 are determined by the selection of material 28. If a dielectric material is chosen filter 10 will have primarily capacitive characteristics. Material 28 may also be a metal oxide varistor material which will provide capacitive and surge protection characteristics. Other materials such as ferrites and sintered polycrystalline may be used wherein ferrite materials provide an inherent inductance along with surge protection characteristics in addition to the improved common mode noise cancellation that results from the mutual coupling cancellation effect. The sintered polycrystalline material provides conductive, dielectric, and magnetic properties. Sintered polycrystalline is described in detail in U.S. Pat. No. 5,500,629 which is herein incorporated by reference.

An additional material that may be used is a composite of high permittivity ferro-electric material and a high permeability ferromagnetic material as disclosed in U.S. Pat. No. 5,512,196 which is incorporated by reference herein. Such a ferroelectric-ferromagnetic composite material can be formed as a compact unitary element which singularly exhibits both inductive and capacitive properties so as to act as an LC-type electrical filter. The compactness, formability and filtering capability of such an element is useful for suppressing electromagnetic interference. In one embodiment the ferroelectric material is barium titanate and the ferromagnetic material is a ferrite material such as one based upon a copper zinc ferrite. The capacitive and inductive characteristics of the ferroelectric-ferromagnetic composites exhibit attenuation capabilities which show no signs of leveling off at frequencies as high as 1 Ghz. The geometry of the ferroelectric-ferromagnetic composite will significantly effect the ultimate capacitive and inductive nature of an electrical filter that employs such a composite. The composite can be adjusted during its manufacturing process to enable the particular properties of a filter to be tuned to produce suitable attenuation for specific applications and environments.

Still referring to FIG. 1, the physical relationship of common ground conductive plates 14, electrode plates 16a and 16b, electrical conductors 12a and 12b and material 28 will now be described in more detail. The starting point is center common ground conductive plate 14. Center plate 14 has the pair of electrical conductors 12 disposed through their respective insulating apertures 18 which maintain electrical isolation between common ground conductive plate 14 and both electrical conductors 12a and 12b. On either side, both above and below, of center common ground conductive plate 14 are electrode plates 16a and 16b each having the pair of electrical conductors 12a and 12b disposed there through. Unlike center common ground conductive plate 14, only one electrical conductor, 12a or 12b, is isolated from each electrode plate, 16a or 16b, by an insulating aperture 18. One of the pair of electrical conductors, 12a or 12b, is electrically coupled to the associated electrode plate 16a or 16b respectively through coupling aperture 20. Coupling aperture 20 interfaces with one of the pair of electrical conductors 12 through a standard connection such as a solder weld, a resistive fit or any other method which will provide a solid and secure electrical connection. For differential and common mode filter 10 to function properly, upper electrode plate 16a must be electrically coupled to the opposite electrical conductor 12a than that to which lower electrode plate 16b is electrically coupled, that being electrical conductor 12b. Differential and common mode filter 10 optionally comprises a plurality of outer common ground conductive plates 14. These outer common ground conductive plates 14 provide a significantly larger ground plane which helps with attenuation of radiated electromagnetic emissions and provides a greater surface area in which to dissipate over voltages and surges. This is particularly true when plurality of common ground conductive plates 14 are not electrically coupled to circuit or earth ground but are relied upon to provide an inherent ground. As mentioned earlier, inserted and maintained between common ground conductive plates 14 and both electrode plates 16a and 16b is material 28 which can be one or more of a plurality of materials having different electrical characteristics.

Figure 1A:
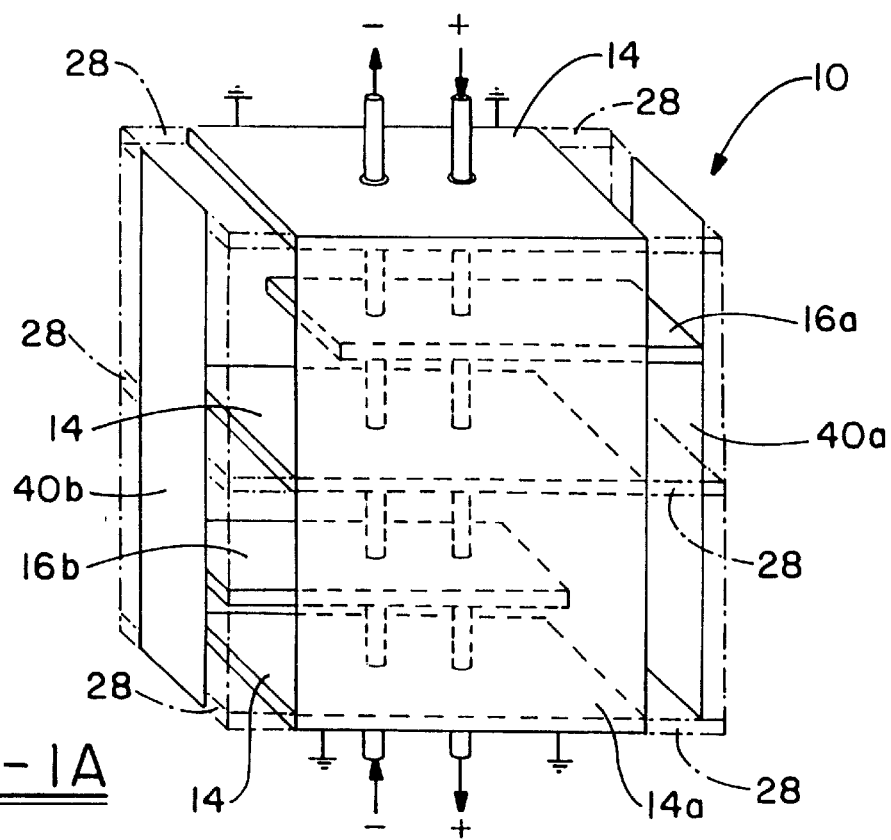
FIG. 1A shows an exploded perspective view of an alternate embodiment of the filter shown in FIG. 1.

FIG. 1A shows an alternative embodiment of filter 10 which includes additional means of coupling electrical conductors or circuit board connections to filter 10. Essentially, the plurality of common ground conductive plates 14 are electrically connected to an outer edge conductive band or surface 14a. Also each electrode plate 16a and 16b has its own outer edge conductive band or surface, 40a and 40b respectively. To provide electrical connections between electrode plate 16a and 16b and their respective conductive band 40a and 40b while at the same time maintaining electrical isolation between other portions of filter 10, each electrode plate 16 is elongated and positioned such that the elongated portion of electrode plate 16a is directed opposite of the direction electrode plate 16b is directed. The elongated portions of electrode plates 16 also extend beyond the distance in which the plurality of common ground conductive plates 14 extend with the additional distance isolated from outer edge conductive bands 40a and 40b by additional material 28. Electrical connection between each of the bands and their associated plates is accomplished through physical contact between each band and its associated common ground conductive or electrode plate.

Figure 2A:
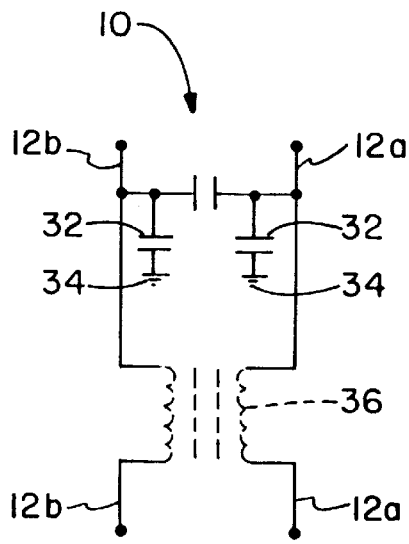
FIG. 2 provides schematic diagrams of the filter shown in FIG. 1 with FIG. 2a being a pure schematic representation and FIG. 2b being a schematic representation of the physical architecture.

FIG. 2 shows two representations of differential and common mode filter 10. FIG. 2a is a schematic representation demonstrating that filter 10 provides a line-to-line capacitor 30 between and coupled to electrical conductors 12a and 12b and two line-to-ground capacitors 32 each coupled between one of the pair of the electrical conductors 12 and inherent ground 34. Also shown in dashed lines is inductance 36 which is provided if material 28 is comprised of a ferrite material, as described in more detail later.

Figure 2B:
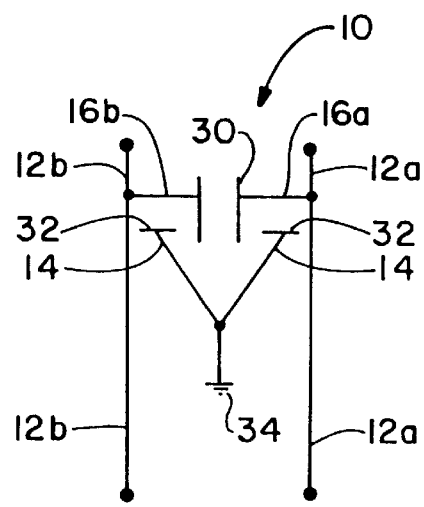

FIG. 2b shows a quasi-schematic of the physical embodiment of filter 10 and how it correlates with the capacitive components shown in FIG. 2a. Line-to-line capacitor 30 is comprised of electrode plates 16a and 16b where electrode plate 16a is coupled to one of the pair of electrical conductors 12a with the other electrode plate 16b being coupled to the opposite electrical conductor 12b thereby providing the two parallel plates necessary to form a capacitor. Center common ground conductive plate 14 acts as inherent ground 34 and also serves as one of the two parallel plates for each line-to-ground capacitor 32.

The second parallel plate required for each line-to-ground capacitor 32 is supplied by the corresponding electrode plate 16. By carefully referencing FIG. 1 and FIG. 2b, the capacitive plate relationships will become apparent. By isolating center common ground conductive plate 14 from each electrode plate 16a or 16b with material 28 having electrical properties, the result is a capacitive network having a common mode bypass capacitor 30 extending between electrical conductors 12a and 12b and line-to-ground decoupling capacitors 32 coupled from each electrical conductor 12a and 12b to inherent ground 34.

Inherent ground 34 will be described in more detail later but for the time being it may be more intuitive to assume that it is equivalent to earth or circuit ground. To couple inherent ground 34, which center and additional common ground conductive plates 14 form, one or more of common ground conductive plates 14 are coupled to circuit or earth ground by common means such as a soldering or mounting screws inserted through fastening apertures 22 which are then coupled to an enclosure or grounded chassis of an electrical device. While differential and common mode filter 10 works equally well with inherent ground 34 coupled to earth or circuit ground, one advantage of filter 10's physical architecture is that a physical grounding connection is unnecessary.

Referring again to FIG. 1 an additional feature of differential and common mode filter 10 is demonstrated by clockwise and counterclockwise flux fields, 24 and 26 respectively. The direction of the individual flux fields is determined and may be mapped by applying Ampere's Law and using the right hand rule. In doing so an individual places their thumb parallel to and pointed in the direction of current flow through electrical conductors 12a or 12b as indicated by the arrows at either ends of the conductors. Once the thumb is pointed in the same direction as the current flow, the direction in which the remaining fingers on the person's hand curve indicates the direction of rotation for the flux fields. Because electrical conductors 12a and 12b are positioned next to one another and represent a single current loop as found in many I/O and data line configurations, the currents entering and leaving differential and common mode filter 10 are opposed thereby creating opposed flux fields which cancel each other and minimize inductance. Low inductance is advantageous in modem I/O and high speed data lines as the increased switching speeds and fast pulse rise times of modem equipment create unacceptable voltage spikes which can only be managed by low inductance surge devices.

It should also be evident that labor intensive aspects of using differential and common mode filter 10 as compared to combining discrete components found in the prior art provides an easy and cost effective method of manufacturing. Because connections only need to be made to either ends of electrical conductors 12 to provide a differential mode coupling capacitor and two common mode decoupling capacitors, time and space are saved.

Figure 3:
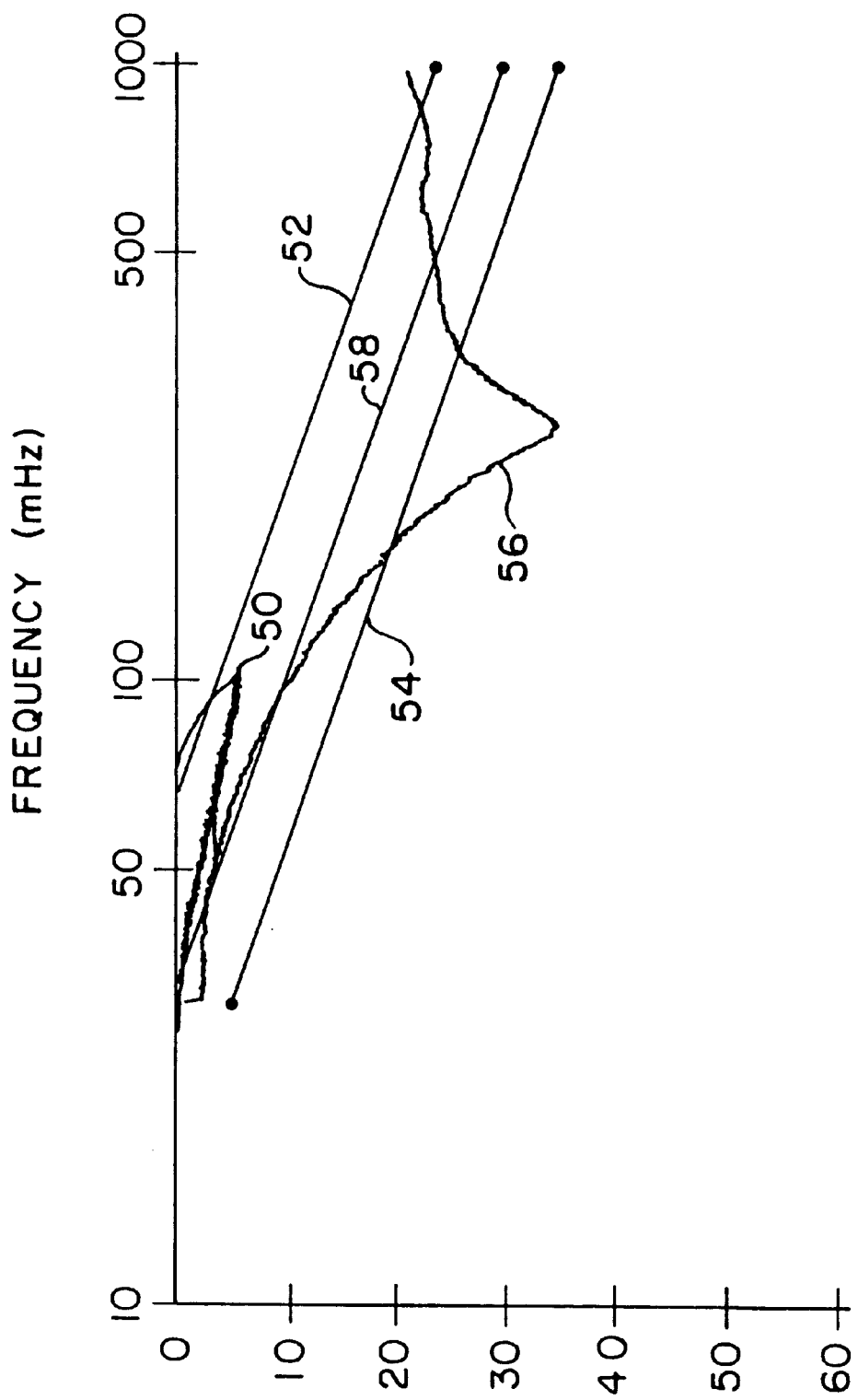
FIG. 3 is a logarithmic graph comparing the filter of FIG. 1 with a filter comprised of prior art chip capacitors showing insertion loss as a function of signal frequency.

FIG. 3 shows a comparison of the change in insertion loss relative to frequency of several chip capacitors of the prior art versus differential and common mode filter 10 of the present invention. The graph shows that chip capacitor 50 configured line-to-line with a value of 82 pF or chip capacitor 56 having a value of 82 pF but configured line-to-ground, both demonstrate varying non-linear characteristics. On the other hand filter 10 configured in any of the following ways demonstrates significantly lower linear insertion losses even up to frequencies of 100 MHZ: (1) with line-to-line capacitor 54 having a value of 82 pF as compared to conventional capacitor 50 having the same value; (2) with line-to-ground capacitor 58 having a value of 82 pF as compared to conventional capacitor 56 having the same value; and (3) line-to-ground capacitor 52 having a value of 41 pF as compared to both conventional capacitors 50 and 56.

Figure 4:
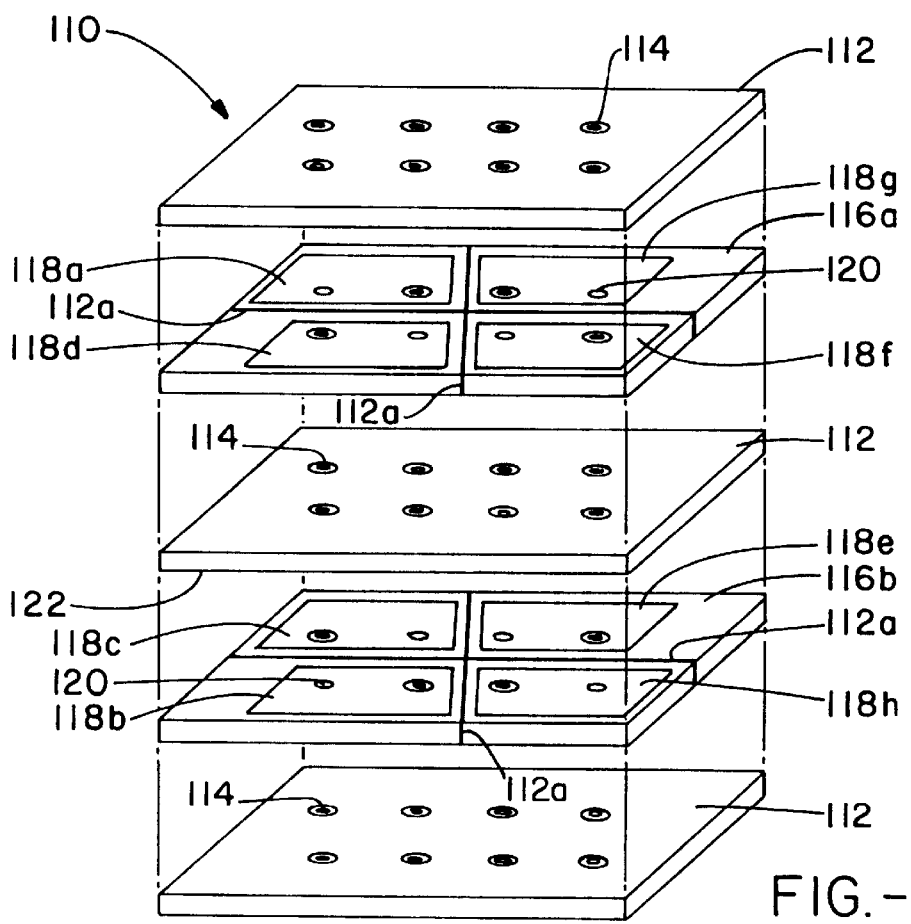
FIG. 4 is an exploded perspective view of a multi-conductor differential and common mode filter for use in connector applications.

An alternate embodiment of the present invention is differential and common mode multi-conductor filter 110 shown in FIG. 4. Filter 110 is similar to filter 10 of FIGS. 1 and 1A in that it is comprised of a plurality of common ground conductive plates 112 and a plurality of conductive electrodes 118a thru 118h to form differential mode coupling capacitors and common mode decoupling capacitor arrangements which act on a plurality of pairs of electrical conductors, not shown in FIG. 4 but similar to electrical conductors 12a and 12b shown in FIGS. 1 and 1A. As described earlier for the single pair conductor filter 10 shown in FIG. 1, common ground conductive plates 112, conductive electrodes 118 and the plurality of electrical conductors are isolated from one another by a pre-selected material 122 having predetermined electrical characteristics such as dielectric material, ferrite material, MOV-type material and sintered polycrystalline material. Each of the plurality of common ground conductive plates 112 has a plurality of insulating apertures 114 in which electrical conductors pass while maintaining electrical isolation from the respective common ground conductive plates 112. To accommodate a plurality of electrical conductor pairs, differential and common mode filter 110 must employ a modified version of the electrode plates described in FIGS. 1 and 1A.

To provide multiple independent conductive electrodes for each pair of electrical conductors, a support material 116 comprised of one of the materials 122 containing desired electrical properties is used. Support plate 116a is comprised of a plurality of conductive electrodes 118b, 118c, 118e and 118h printed upon one side of plate 116a with one coupling aperture 120 per electrode. Support plate 116b is also comprised of a plurality of conductive electrodes 118a, 118d, 118f and 118g printed upon one side of plate 116b. Support plates 116a and 116b are separated and surrounded by a plurality of common ground conductive plates 112. The pairs of incoming electrical conductors each have a corresponding electrode pair within filter 110. Although not shown, the electrical conductors pass through the common ground conductive plates 112 and the respective conductive electrodes. Connections are either made or not made through the selection of coupling apertures 120 and insulating apertures 114. The common ground conductive plates 112 in cooperation with conductive electrodes 118a thru 118h perform essentially the same function as electrode plates 16a and 16b of FIGS. 1 and 1A.

FIG. 5 shows schematic diagrams of prior art multicapacitor components and differential and common mode multi-conductor filter 110 of the present invention. FIG. 5a is a schematic of prior art capacitor array 130. Essentially, a plurality of capacitors 132 are formed and coupled to -one another to provide common ground 136 for array 130 with open terminals 134 provided for connecting electrical conductors to each capacitor 132. These prior art capacitor arrays only allowed common mode decoupling of individual electrical conductors when open terminal 134 of each capacitor 132 was electrically connected to individual electrical conductors.

FIG. 5b shows a schematic representation of differential and common mode multi-conductor filter 110 having four differential and common mode filter pin pair pack arrangements. The horizontal line extending through each pair of electrodes represents the common ground conductive plates 112 with the lines encircling the pairs being the isolation bars 112a. The isolation bars 112a are electrically coupled to common ground conductive plates 112 providing an inherent ground grid separating each of the electrode plates 118a through 118h from one another. The corresponding conductive electrodes 118a thru 118h positioned on support material plates 116a and 116b, both above and below the center common ground conductive plate 112, and form line-to-ground common mode decoupling capacitors. Each plate, common ground plates 112 and support material plates 116a and 116b, is separated from the others by dielectric material 122. When filter 110 is connected to paired electrical conductors via coupling apertures 120 such as those found in electrode plates 118a and 118c, filter 110 forms a line-to-line differential mode filtering capacitor.

Again referring to FIG. 4, multi-conductor filter 110 is shown having not only a center common ground conductive plate 112 but outer common ground conductive plates 112. As described in relation to FIGS. 1 and 1A these outer common ground conductive plates 112 provide a significantly larger ground plane for filter 110 which helps with attenuation of radiated electromagnetic emissions, provides a greater surface area to dissipate and/or absorb over voltages, surges and noise, and effectively acts as a Faraday shield. This is particularly true when plurality of common ground conductive plates 112 are not electrically connected to circuit or earth ground but are instead relied upon to provide an inherent ground.

A further variation of the present invention is differential and common mode multi-conductor filter 680 shown in FIG. 22. Filter 680 has been optimized for use with computer and telecommunications equipment and in particular has been configured for use with RJ 45 connectors. To obtain improved filters performance, filter 680 includes built in chassis and circuit board low frequency noise blocking capacitors in addition to a plurality of differential and common mode filters. As shown in FIG. 22a, the physical construction of filter 680 is substantially similar to filter 110, shown in FIG. 4, and is comprised of a plurality of common ground conductive plates 112, first and second electrode plates 676 and 678 having a plurality of conductive electrodes to form multiple differential and common mode filters including chassis and board blocking capacitors. As described for earlier embodiments, common ground conductive plates 112, conductive electrodes 686, 688, 690 and 692, blocking electrodes 682 and 684, and the electrical conductors (not shown) which pass through the various plates are all isolated from one another by material 122. To realize particular predetermined electrical characteristics in filter 680, as in all other embodiments of the present invention, material 122 can consist of dielectrics, ferrites, MOV-type material or sintered polycrystaline. Each common ground conductive plate 112 includes a plurality of insulating apertures 114 in which electrical conductors pass while maintaining electrical isolation from common ground conductive plate 112. To obtain the additional chassis and board noise blocking capacitors, filter 680 employs a modified version of the electrode plates of FIG. 1.

As described for FIG. 4, to provide multiple independent components for a number of pairs of electrical conductors, material 122 also serves as support material 116 which is used to fabricate first and second electrode plates 676 and 678. First electrode plate 676 is made up of first and second conductive electrodes 682 and 686 and blocking electrode 688, all printed upon one side of support material 116. Second electrode plate 678 is made up of first and second conductive electrodes 684 and 690 and blocking electrode 692, again printed upon one side of support material 116. First and second electrode plates 676 and 678 are then separated and surrounded by common ground conductive plates 112. What differs in filter 680 from previous embodiments which allows for the combination of differential and common mode filters with built in chassis and board noise blocking capacitors is the configuration of first and second conductive electrodes and blocking electrodes on first and second electrode plates 676 and 678. First and second conductive electrodes 686 and 688 of first electrode plate 676 each include one coupling aperture 120 disposed in the electrode. Blocking electrode 682 is formed to partially surround first and second conductive electrodes 686 and 688 and includes a plurality of insulating apertures 114 and coupling apertures 120. Second electrode plate 678 is identical to first electrode plate 676 with first and second conductive electrodes 690 and 692 corresponding to first and second conductive electrodes 686 and 688 and blocking electrode 684 corresponding with blocking electrode 682. As is clearly shown in FIG. 22a, when coupled between the various common ground conductive plates 112, first and second electrode plates 676 and 678 are arranged in opposite directions from one another. This particular alignment of first and second electrode plates 676 and 678 allows filter 680 to have a traditional RJ 45 pinout configuration when used in a connector application. It should be noted that Applicant contemplates other configurations of conductive and blocking electrodes depending upon the desired pinout or wiring arrangement desired and the inverted arrangement of first and second electrode plates 676 and 678 is not required.

Figure 22A:
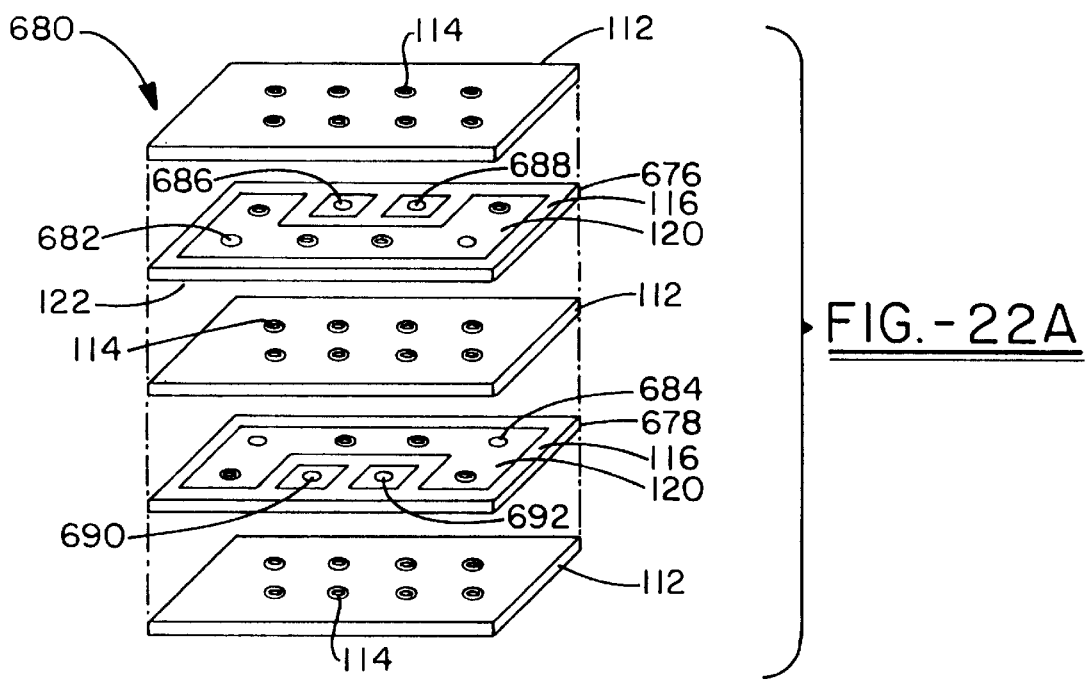
FIG. 22a is an exploded prospective view of an alternate multi-conductor differential and common mode filter for use in connector applications.
Figure 22B:
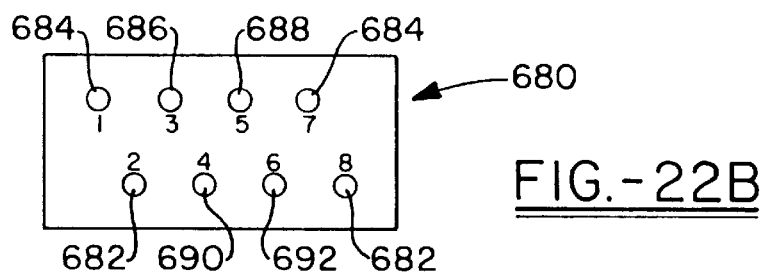

As in other embodiments, a number of electrical conductors will pass through common ground conductive plates 112 and first and second electrode plates 676 and 678. Although the electrical conductors are absent, FIG. 22b shows that this particular embodiment of filter 680 is adapted to accept eight conductors in accordance with RJ 45 connector standards. The interaction of the various conductive electrodes within filter 680 will now be described by refering FIGS. 22a through 22d with FIG. 22b included to further correlate the electrical representation with the physical embodiment of filter 680. FIG. 22d is an alternate electrical representation of filter 680 which should also be referred to as needed. Signal ground (SG) for filter 680 is provided by the combination of common ground conductive plates 112 which act as an inherent ground. The physical separation of the various conductive electrodes of first and second electrode plates 676 and 678 by the conductive plane of common ground conductive plates 112 provides a substantial ground plane for filter 680 which inherently acts as a ground and assists with attenuation of radiated electromagnetic admissions, provides a greater surface area to dissipate and/or absorb over voltages, surges and noise, and effectively acts as a Faraday shield protecting the filter from external electrical noise and preventing radiation of the same by filter 680.

Figure 22C:
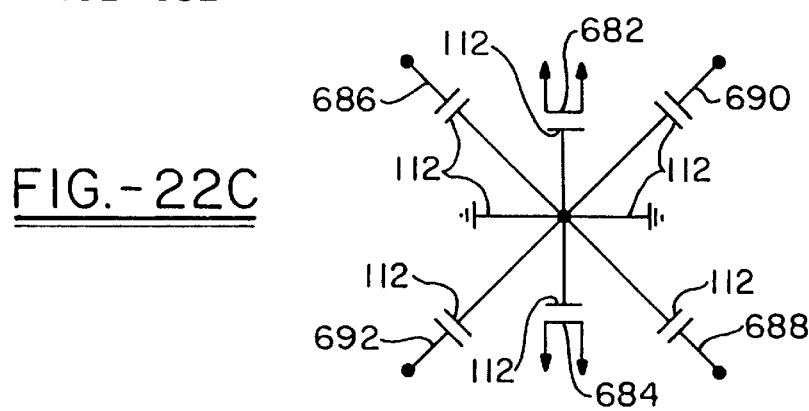
Figure 22D:
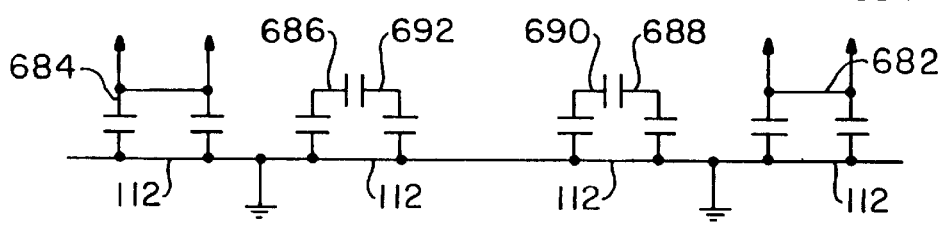

Referring to the various electrical conductors (not shown) by the numbers 1 through 8 as shown in FIGS. 22b, 22c and 22d, the electrical conductors 3 and 5 are connected through coupling apertures 120 to first and second conductive electrodes 686 and 688 respectively. Electrical conductors 4 and 6 are connected through coupling apertures 120 to conductive electrodes 690 and 692 respectively. Conductors 1 and 7 are connected through coupling apertures 120 to blocking electrode 684 and electrical conductors 2 and 8 are similarly connected through coupling apertures 120 to blocking electrode 682. Referring to FIG. 22d, electrical conductors 3 and 6 are filtered differentially by the interaction of first and second conductive electrodes 686 and 692 which act as opposing plates to form a line-to-line capacitor between electrical conductors 3 and 6. The same electrical conductors each receive common mode filtering through line-to-ground capacitors formed by the interaction of first and second conductive electrodes 686 and 692 with common ground conductive plates 112 which forms line-to-ground capacitors between each electrical conductor and the inherent ground formed by the plurality of common ground conductive plates 112.

The same relationship exists for electrical conductors 4 and 5 which are connected to first and second conductive electrodes 690 and 688 respectively. First and second conductive electrodes 690 and 688 form line-to-line capacitors and each interacts with common ground conductive plates 112 to form individual common mode filter capacitors for each electrical conductor. In addition to the plurality of differential and common mode filters created by the interaction between the various conductive electrodes and common ground conductive plates, chassis and board noise blocking capacitors are also formed by the interaction of common ground conductive plates 112 and blocking electrodes 682 and 684. For instance, chassis ground is connected to the electrical conductors 1 and 7, both of which are electrically connected through coupling apertures 120 to blocking electrode 682 thereby forming one plate of the noise blocking capacitors. The other plate of the noise blocking capacitors is formed by common ground conductive plates 112 which interact with blocking electrode 682. Although interchangeable, electrical conductors 2 and 8 also provide board noise blocking capacitors formed by the interaction of common ground conductive plates 112 and blocking electrode 682. Both the chassis and board blocking noise capacitors allow the inherent ground formed by common ground conductive plates 112 to be capacitively decoupled thereby blocking low frequency electrical noise from the signal carrying conductors. This improves differential and common mode filter performance by essentially electrically cleansing the inherent ground formed by common ground conductive plates 112.

FIG. 6 illustrates a further embodiment of the present invention which provides input/output data line pair filtering for a large number of electrical conductor pairs typical of todays high density information and data buses. Differential and common mode high density filter 150 is comprised of a plurality of common ground conductive plates 112 containing a plurality of insulating apertures 114 and conductive electrode plates 116a and 116b each having electrode patterns 118, insulating apertures 114 and coupling apertures 120. The stacking sequence is reflected in FIG. 6 recognizing that dielectric material will surround each of the individual plates as described for previous embodiments.

Figure 6A:
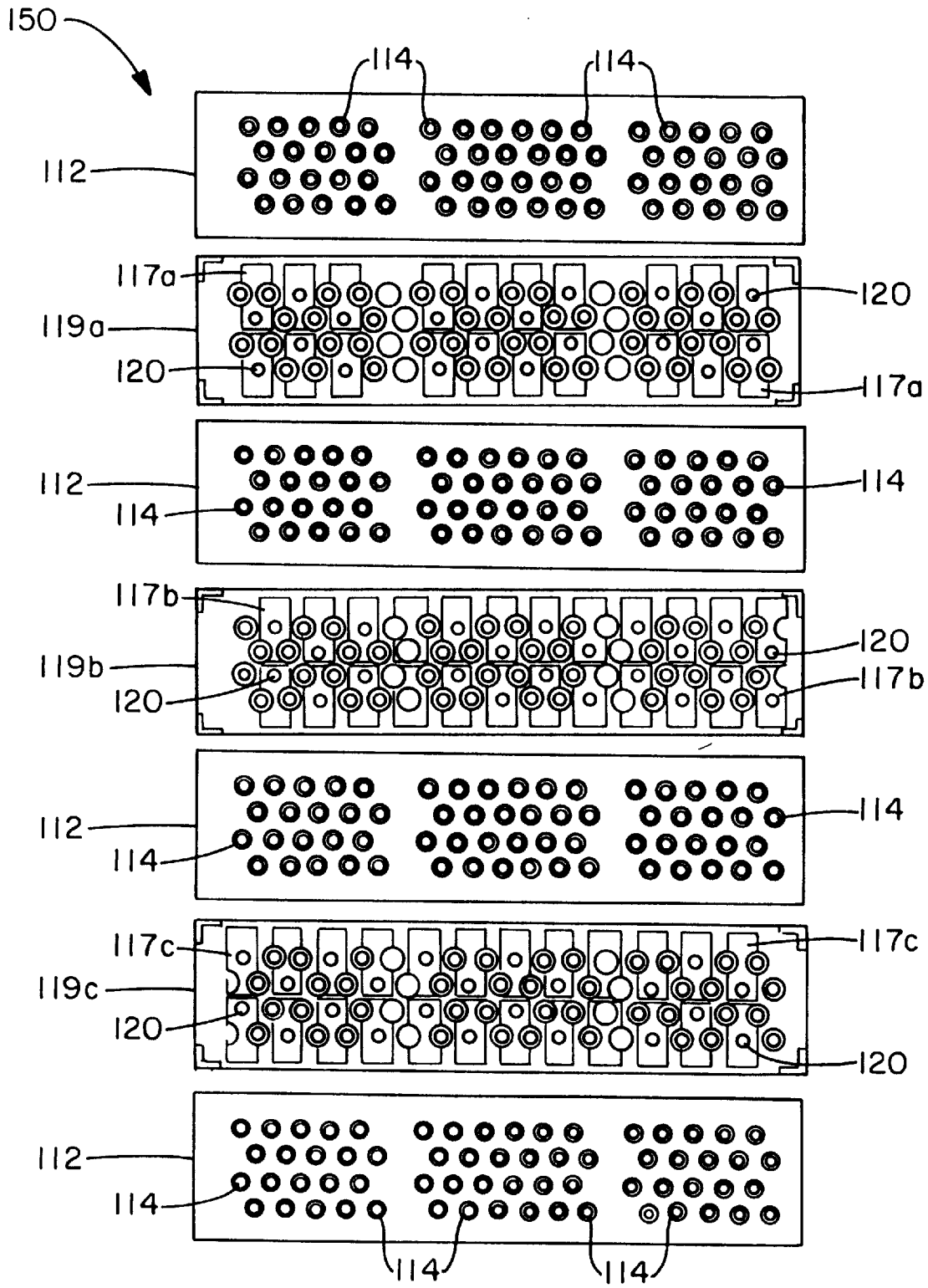
FIG. 6A is a top plan view of the plurality of common ground conductive and electrode plates which make up an alternate high density multi-conductor filter as shown in FIG. 6.

FIG. 6A presents an alternative approach in which differential and common mode high density filter 150 utilizes a tri-coupling of the electrodes to develop a higher capacitance to ground and line-to-line. Again, filter 150 is comprised of a plurality of common ground conductive plates 112 each having a plurality of insulating apertures 114, conductive electrode plates 119a thru 119c with their respective electrode patterns 117a thru 117c. Each conductive electrode plate, 119a through 119c, contains a plurality of insulating apertures 114 and coupling apertures 120 in predetermined positions to allow pairs of electrical conductors to pass through while selectively coupling the electrical conductors to create the desired filter architecture. The stacking sequence of the plates shown in FIG. 6A is again similar to those shown for FIGS. 1, 1A, 4 and 6 and again a predetermined dielectric material 122 surrounds each of the individual plates in varying thicknesses.

FIGS. 7, 8 and 9 show single aperture electrode plate 70 and the use of a plurality of such plates in an alternative embodiment of the differential and common mode filter of the present invention. FIG. 7 shows the two sides of electrode plate 70 with FIG. 7a being the front and FIG. 7b being the back. Referring to FIG. 7a, electrode plate 70 is comprised of material 72 having predetermined electrical properties, such as a dielectric or other material as described earlier, where material 72 is molded into a desired shape which in this case is a disk. Aperture 78 is disposed through electrode plate 70 to allow an electrical conductor to pass. The front of electrode plate 70 is partially covered by conductive surface 74 to create isolation band 82 about the outer perimeter of electrode plate 70. Surrounding aperture 78 is solder band 80 which, once heated, will adhere to an electrical conductor disposed through aperture 78 and electrically connect the conductor to conductive surface 74. Referring now to FIG. 7b, the backside of electrode plate 70 is similar to the front side in that conductive surface 74 is adhered to material 72 in such a fashion as to provide isolation band 82 around its outer perimeter. Differing from the front side, aperture 78 is surrounded by isolation band 76 to prevent any electrical connection between electrical conductors and conductive surface 74 of the backside of electrode plate 70.

FIGS. 8 and 9 demonstrate how multiple electrode plates 70 are used to create differential and common mode filter 90. The construction of filter 90 is similar to previous embodiments in that common ground conductive plate 98 is sandwiched between at least two electrode plates 70 to provide the parallel plate arrangement necessary to form a plurality of capacitive elements. As shown in FIG. 9, one electrode plate 70 is coupled to one side of common ground conductive plate 98 with a second electrode plate 70 being coupled to the opposite side of plate 98 and offset a distance great enough to allow electrical conductors 92a and 92b to pass through one electrode plate 70 without interference from the other electrode plate 70 coupled to the opposite side of common ground conductive plate 98. Although not clearly shown it should be apparent that common ground conductive plate 98 includes apertures in predetermined positions which correspond with the associated apertures of electrode plates 70 to allow electrical conductors 92a and 92b to pass through as shown in FIG. 8.

Common ground conductive plate 98 serves as and provides inherent ground 96, which may be connected to earth or signal ground if desired. Fastening apertures 22 allow filter 90 to be mechanically coupled to a structure. One means of physically coupling electrode plate 70 to common ground conductive plate 98 is shown in FIG. 8. Sandwiched between common ground conductive plate 98 and electrode plate 70's backside is solder weld 84 which when heated adheres to conductive surface 74 of the backside of electrode plate 70 and the corresponding surface of common ground conductive plate 98. When connecting electrode plate 70 to common ground conductive plate 98, electrode plate 70's backside always faces the corresponding side of common ground conductive plate 98. The same mechanical coupling means is used for both electrode plates. Solder band 80 is also shown for each electrode plate 70 which only couples one of the two electrical conductors 92a and 92b, to their respective electrode plates. The arrangement of common ground conductive plate 98 and electrode plates 70 provides line-to-line differential mode filtering between and line-to-ground decoupling for each electrical conductor 92a and 92b. The differential mode filtering is accomplished by conductive surfaces 74 of the front sides of both electrode plates 70 which act as the parallel plates of a capacitor coupled between electrical conductors 92a and 92b or line-to-line. The line-to-ground decoupling is provided by conductive surfaces 74 of each electrode plate 70 acting as one capacitive plate and common ground conductive plate 98 acting as the other parallel capacitive plate. The parallel capacitive plate provided by common ground conductive plate 98, which serves as inherent ground 96, provides the ground decoupling connection for each electrical conductor, 92a and 92b.

Differential and common mode filter 90 shown in FIGS. 8 and 9 is advantageous in that its construction is relatively simple and its voltage and current handling capacities are only limited by its physical structure which may easily be enlarged or reduced depending upon the desired characteristics.

Figure 26A:
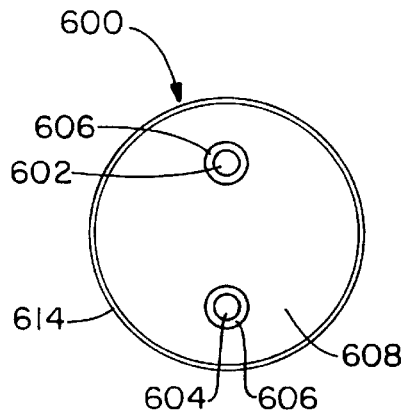
FIGS. 26a and 26c are the front and back, respectively, of the electrode plate
Figure 26B:
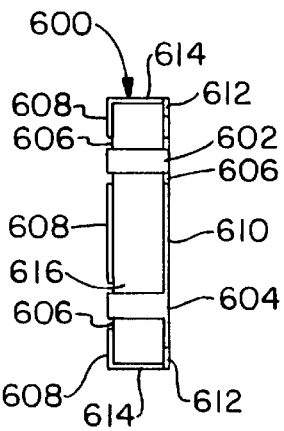
FIG. 26b is a side elevational view in cross section of the same electrode plate.
Figure 26C:
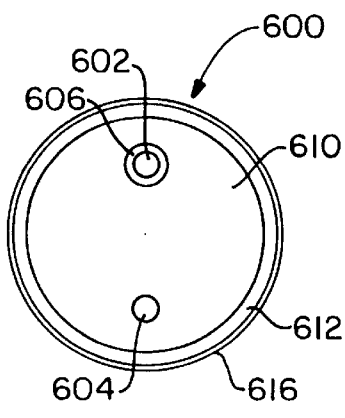
Figure 27:
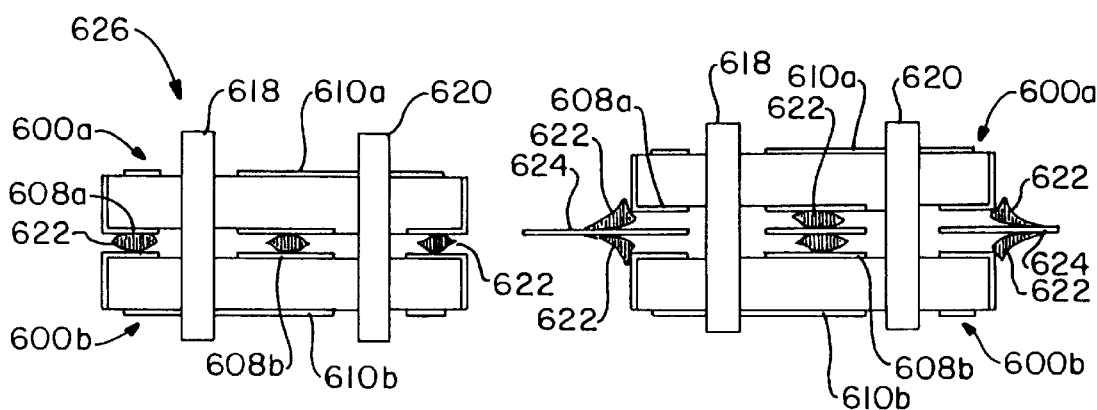
FIG. 27 is a side elevational view in cross section of an application in which two electrode plates, as shown in FIG. 26, are employed in an electronic circuit.
Figure 28:
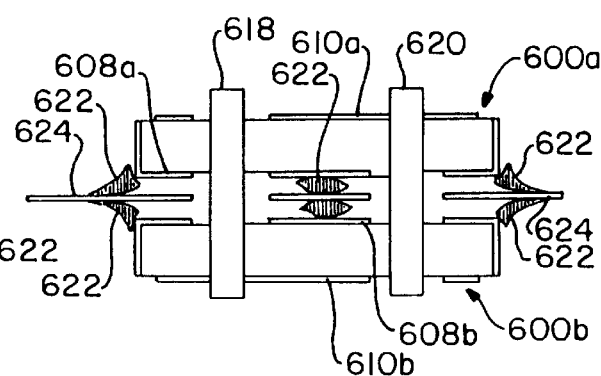
FIG. 28 is a side elevational view in cross section of a further application in which two electrode plates, as shown in FIG. 26, and a ground plane are employed in an electronic circuit.

FIGS. 26, 27 and 28 disclose double aperture electrode plate 600 and the use of a plurality of such plates in further alternative embodiments of the differential and common mode filters of the present invention. Referring to FIG. 26a, electrode plate 600 is comprised of material 616 having predetermined electrical properties, with material 616 being molded into a desired shape shown here as being a disk. A first side of double aperture electrode plate 600 is shown in FIG. 26a and includes first and second apertures 602 and 604 each including an isolation band 606 which separates the apertures from first conductive surface 608. A second side of double aperture electrode plate 600 is shown in FIG. 26c and includes first aperture 602 having isolation band 606 and second aperture 604 directly connected to second conductive surface 610 which spans most of the second side of double aperture electrode plate 600, with the exception of isolation band 612 which runs along the outer perimeter of plate 600. FIG. 26b shows first conductive surface 608 is electrically coupled to side conductive surface 614 which encircles double aperture electrode plate 600. Isolation band 612, located along the perimeter of the second side of double aperture electrode plate 600, physically separates and electrically isolates first and second conductive surfaces 608 and 610 from one another.

When two electrical conductors pass through first and second apertures 602 and 604, only the electrical conductor passing through aperture 604 will be electrically connected to second conductive surface 610. The function of double aperture electrode plate 600 is identical to single aperture electrode plate 70 shown in FIG. 7 with the only difference being electrode plate 600 does not have to be arranged in an offset manner to allow passage of opposing electrical conductors as was shown and described for FIG. 9.

FIG. 27 shows how multiple double aperture electrode plates 600 are used to create differential and common mode filter 626 which is accomplished by electrically connecting two double aperture electrode plates 600 so the first side of each electrode plate 600, shown in FIG. 26a, faces the first side of the opposing electrode plate 600 with first conductive surface 608 of each electrode plate 600 electrically connected through means known in the art such as solder 622 melted between the two first conductive surfaces 608. Two electrical conductors, 618 and 620, pass through the aligned apertures of each double aperture electrode plate 600 with electrical conductor 618 electrically connected to second conductive surface 610b of electrode plate 600b and electrical conductor 620 electrically connected to second conductive surface 610a of electrode plate 600a. Following the same principles set forth for the differential and common mode architecture of the present invention, first conductive surfaces 608a and 608b form and act as a common ground conductive plate which provides an inherent ground for differential and commode mode filter 626. Second conductive surfaces 610a and 610b of each electrode plate 600a and 600b act as the individual conductive electrodes forming two plates which make up a differential capacitor coupled between electrical conductors 618 and 620. Second conductive surfaces 610a and 610b also form common mode decoupling capacitors when taken in conjunction with first conductive surfaces 608a and 608b which act as the inherent ground. One advantage to double aperture electrode plate 600, as compared to the single aperture electrode plate 70 shown in FIG. 7, is that a separate common ground conductive plate is unnecessary. First conductive surfaces 608a and 608b act as and form the common ground conductive plate. If desired, a separate common ground conductive plate 624 having aligned insulated apertures may be positioned between double aperture electrode plates 600a and 600b, as shown in FIG. 28, to provide an enhanced inherent ground with a greater conductive area for distributing electrical noise and heat.

One trend found throughout modem electronic devices is the continuous miniaturization of equipment and the electronic components which make up that equipment. Capacitors, the key component in differential and common mode filter arrangements, have been no exception and their size has continually decreased to the point where they may be formed in silicon and imbedded within integrated circuits only seen with the use of a microscope. One miniaturized capacitor which has become quite prevalent is the chip capacitor which is significantly smaller than standard through hole or leaded capacitors. Chip capacitors employ surface mount technology to physically and electrically connect to electrical conductors and traces found on circuit boards. The versatility of the architecture of the differential and common mode filter of the present invention extends to surface mount technology as shown in FIG. 10. Surface mount differential and common mode filter 400 is shown in FIG. 10a with its internal construction shown in FIG. 10b. Referring to FIG. 10b, common ground conductive plate 412 is sandwiched between first differential plate 410 and second differential plate 414. Common ground conductive plate 412 and first and second differential plates 410 and 414 are each comprised of material 430 having desired electrical properties dependant upon the material chosen. As for all embodiments of the present invention, Applicant contemplates the use of a variety of materials such as but not limited to dielectric material, MOV-type material, ferrite material, film such as Mylar and newer exotic substances such as sintered polycrystalline.

First differential plate 410 includes conductive electrode 416 coupled to the top surface of material 430 in a manner which leaves isolation band 418 surrounding the outer perimeter of first differential plate 410 along three of its four sides. Isolation band 418 is simply a portion along the edge of material 430 that has not been covered by conductive electrode 416. Second differential plate 414 is essentially identical to first differential plate 410 with the exception being its physical orientation with respect to that of first differential plate 410. Second differential plate 414 is comprised of material 430 having conductive electrode 426 coupled to the top surface of material 430 in such a manner as to leave isolation band 428 surrounding the outer perimeter of second differential plate 414 along three of its four sides. What is important to note about first and second differential plates 410 and 414's physical orientation with respect to one another is that the one side of each plate in which isolation bands 418 and 428 do not circumscribe are arranged 180° apart from one another. This orientation allows each electrical conductor to be coupled to either individual plate 410 or 414 but not both.

Common plate 412 is similar in construction to first and second differential plates 410 and 414 in that it to includes material 430 with common conductive electrode 424 coupled to its top surface. As can be seen from FIG. 10b, common plate 412 has two isolation bands 420 and 422 positioned at opposite ends. Common plate 412 is aligned in between first and second differential plates 410 and 414 so that isolation bands 420 and 422 are aligned with the ends of first and second differential plates 410 and 414 which do not have isolation bands. All three plates, common plate 412 and first and second differential plates 410 and 414 do not have any type of conductive surface beneath each plate and therefore when the plates are stacked one on top of the other, conductive electrode 426 is isolated from common conductive electrode 424 by the backside of common plate 412. In a similar fashion common conductive electrode 424 is isolated from conductive electrode 416 by the backside of first differential plate 410 which is comprised of material 430.

Referring now to FIG. 10a the construction of surface mount differential and common mode filter 400 will be further described. Once common plate 412 and first and second differential plates 410 and 414 are sandwiched together according to the arrangement shown in FIG. 10b, a means for coupling electrical conductors to the different electrodes must be included. Electrical conductors are coupled to surface mount differential and common mode filter 400 through first differential conductive band 404 and second differential conductive band 406 which are isolated from common conductive band 402 by isolation bands 408 positioned in between bands 402, 404 and 406. Common conductive band 402 and isolation bands 408 extend 360° around the body of filter 400 to provide isolation on all four sides. First and second differential conductive bands 404 and 406 not only extend 360° around filter 400 but also extend to cover ends 432 and 434, respectively.

By referring back and forth between FIGS. 10a and 10b, the coupling between the bands and the plates can be seen. First differential conductive band 404 including end 434 maintains electrical coupling with conductive electrode 416 which does not have isolation band 418 extending to the end of first differential plate 410. Second differential conductive band 406 is electrically isolated from common plate 412 and first differential plate 410 due to isolation band 422 and 428 respectively. In a similar fashion to that just described, second differential conductive band 406 including end 432 is electrically coupled to conductive electrode 426 of second differential plate 414. Due to isolation bands 420 and 418 of common plate 412 and first differential plate 410, second differential conductive band 406 is electrically isolated from first differential plate 410 and common plate 412.

Electrical coupling of common conductive band 402 to common plate 412 is accomplished by the physical coupling of sides 436 of common conductive band 402 to common conductive electrode 424 which lacks isolation bands along the sides of common plate 412. To maintain electrical isolation of common conductive electrode 424 from first and second differential conductive bands 404 and 406, isolation bands 420 and 422 of common plate 412 prevent any physical coupling of ends 432 and 434 of first and second differential conductive bands 404 and 406 with common conductive electrode 424.

As with the other embodiments of the differential and common mode filter of the present invention, conductive electrodes 416 and 426 of first and second differential plates 410 and 414 act as a line-to-line differential mode capacitor when electrical conductors are coupled to first and second differential conductive bands 404 and 406. Line-to-ground decoupling capacitors are formed between each conductive electrode, 416 and 426 respectively, and common conductive electrode 424 which provides the inherent ground.

Figure 11A:
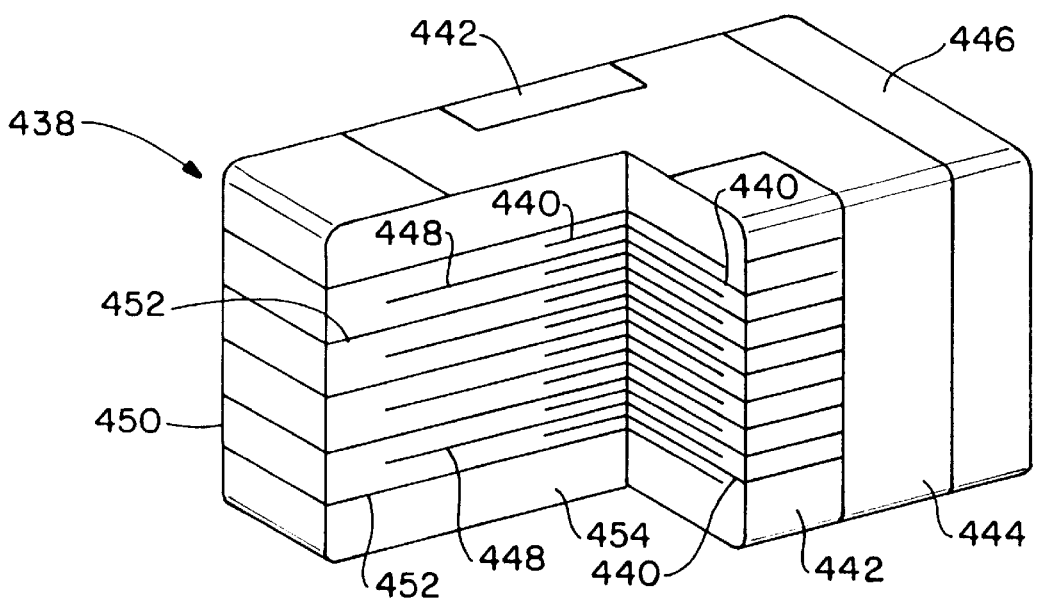
FIG. 11 shows a further embodiment of the filter shown in FIG. 10 with FIG. 11a showing a perspective view in cut away of the filter and FIG. 11b showing a schematic representation of the same.

FIG. 11 shows surface mount differential and common mode filter 438 which is a further embodiment of the filter shown in FIG. 10. The cutaway perspective view more clearly shows how first and second differential conductive bands 446 and 450, electrically connect to electrode plates 448 and 452. Electrical connection between common conductive band 442 and common ground conductive plates 440 is also shown with the only difference being that common conductive band 442 is not continuous for 360° around the body of surface mount filter 438 as was shown in FIG. 10.

Figure 11B:
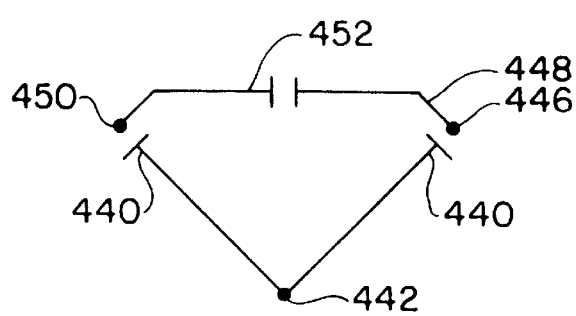

Another striking difference between filter 438 of FIG. 11 and filter 400 of FIG. 10 is that filter 438 is comprised of a plurality of electrode and common ground conductive plates 448, 452, and 440. The advantage to using a plurality of common ground conductive and electrode plates is that greater capacitance values are obtained while keeping the size of surface mount filter 438 to a minimum. Capacitors, like resistors, can be placed in series and in parallel. While the overall resistance of a plurality of resistors in series is the sum of their individual values, the opposite relationship exists for capacitors. To achieve an additive effect capacitors must be placed in parallel with one another which filter 438 does by having a plurality of plates coupled to first and second differential conductive bands 446 and 450 and common conductive band 442. As in previous embodiments, material 454 having desired electrical properties surrounds and isolates the plurality of electrode plates 448 and 452 and common ground conductive plates 440 from one another while imparting its corresponding electrical properties to the differential and common mode filter arrangement. FIG. 11*b* shows a schematic equivalent for surface mount differential and common mode filter 438 and the relationship between the plurality of common ground conductive plates 440 and the plurality of electrode plates 448 and 452.

Electrode plates 448 and 452 are each electrically coupled to their respective conductive bands, 450 and 446. Electrical conductors are then coupled to first and second differential conductive bands 446 and 450 with a plurality of electrode plates 448 and 452 acting in parallel to provide one overall capacitive value coupled between the electrical conductors providing line-to-line differential mode coupling. The plurality of common ground conductive plates 440 act in conjunction with electrode plates 448 and 452 to provide line-to-ground decoupling capacitors between each electrical conductor and common conductive band 442. The plurality of common ground conductive plates 440 serve as the inherent ground which also may be connected to signal or earth ground through common conductive band 442. Again, the physical architecture of the present invention allows for numerous variations and by changing the number of plates and/or their sizes, a wide range of capacitive values and filter characteristics may be obtained.

FIG. 12 shows an alternative multi-component surface mount differential and common mode filter which combines two individual filters into one electronic component. It should be understood that any number of individual filters can be incorporated into a single electronic component and that the invention is not limited to two individual filters. FIG. 12*a* shows one interconnect arrangement with FIG. 12*b* through 12*e* disclosing the internal electrode and common ground conductive layers. First and second differential conductive bands 154 and 156 are coupled to electrode plates 153 and 155 respectively and bands 154' and 156' are similarly coupled to electrode plates 153' and 155'. Multi-component surface mount filter 160 is also comprised of material 166 having predetermined electrical properties, as described previously, disbursed in between the plurality of electrode and common ground conductive layers. Common ground conductive band 164 is electrically connected to common ground conductive plate 163. What should be noted is that not only does Applicant contemplate multiple components within a single electronic package but that the shape and arrangement and/or length and width of first and second differential conductive bands 154 and 156 and common conductive band 164 may be varied to accompany any type of printed circuit board footprint desirable. The conductive and common bands are only required to be electrically coupled to the associated electrode plates and common ground conductive plate 163 while maintaining electrical isolation among one another. The concept disclosed in FIG. 12 could just as easily be extended to incorporate 10, 20 or 100 differential and common mode filters if desired. Multi-component surface mount differential and common mode filter 160 is particularly useful for providing filtering to large data buses typically consisting of 32 or 64 data lines. These data buses handle digital information at extremely high frequencies emitting large amounts of electromagnetic energy and are also extremely susceptible to over currents and voltage surges which can damage circuitry and distort data.

FIGS. 23 and 24 disclose applications for the previously described surface mount filter, shown in FIG. 11, including electrical representations of the applications. FIG. 23 shows the combination of differential and common mode MOV filter 400*a* coupled in parallel with differential and common mode capacitive filter 400*b* which provides both differential and common mode surge protection with increased capacitance normally not obtainable with MOV devices alone. FIG. 23*b* shows filters 400*a* and 400*b* physically stacked together such that first differential conductive bands 446*a* and 446*b* are electrically coupled to one and another, second differential conductive bands for 450*a* and 450*b* are electrically coupled to one and another and common conductive ground bands 442*a* and 442*b* are electrically coupled to each another and represented as 443. As the physical construction of filters 400*a* and 400*b* are identical, with the exception being the electrical characteristics of the material in each used to separate the various conductive electrodes, isolation bands 444*a* and 444*b* of both filters are also aligned. Although not shown, Applicant contemplates components of the present invention that are not physically identical also being stacked or combined dependent upon the particular application in which the components are used. The benefit of the physical configuration of surface mount filters or components of the present invention is that they can be stacked saving space within circuits consistent with the trend in modem electronics of miniaturization.

The result is shown in FIG. 23*a* where electrical conductors (not shown) would be coupled between first differential conductive bands 446*a* and 446*b* and second differential conductive bands 450*a* and 450*b* resulting in differential and common mode filtering and surge suppression. This combination improves overall filter response due to the increased capacitance combined with over voltage and surge protection. FIG. 24 shows an alternate application in which surface mount capacitor 720 is coupled between first and second differential conductive bands 446 and 450 of differential and common mode MOV surge/filter 400*a* with the resulting electrical representation showing the line-to-line capacitance provided by capacitor 720. This circuit configuration again increases the effective capacitance of differential and common mode MOV surge/filter 400*a*. As in FIG. 23, electrical conductors (not shown) are coupled between the combination of first differential conductive band 446 and first conductive band 724 and the combination of second differential conductive band 450a and second conductive band 722.

Figure 39:
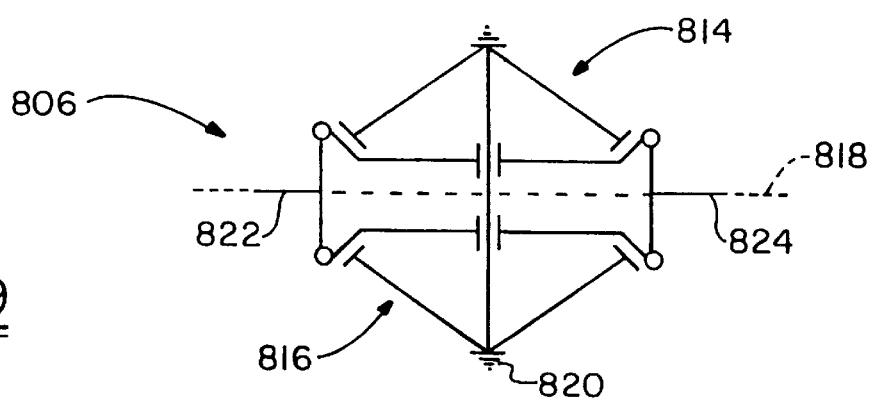
FIG. 39 is a schematic representation of the multi-component filter shown in FIG. 38.
Figure 40A:
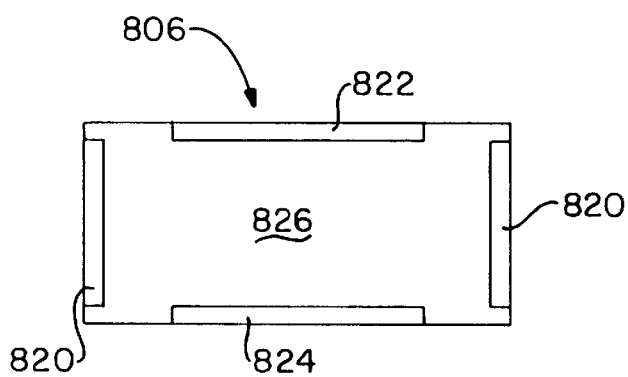
FIG. 40a is a top plan view of the filter.
Figure 40C:
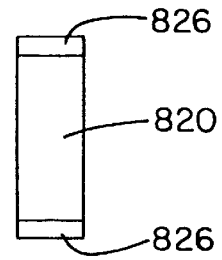
FIG. 40b is a front elevational view of the filter and FIG. 40c is a side elevational view of the filter.
Figure 40B:
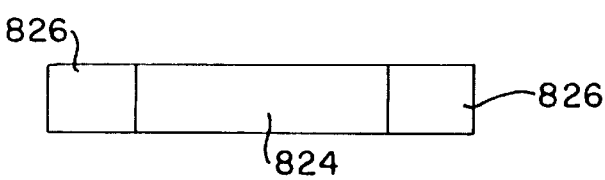
Figure 38:
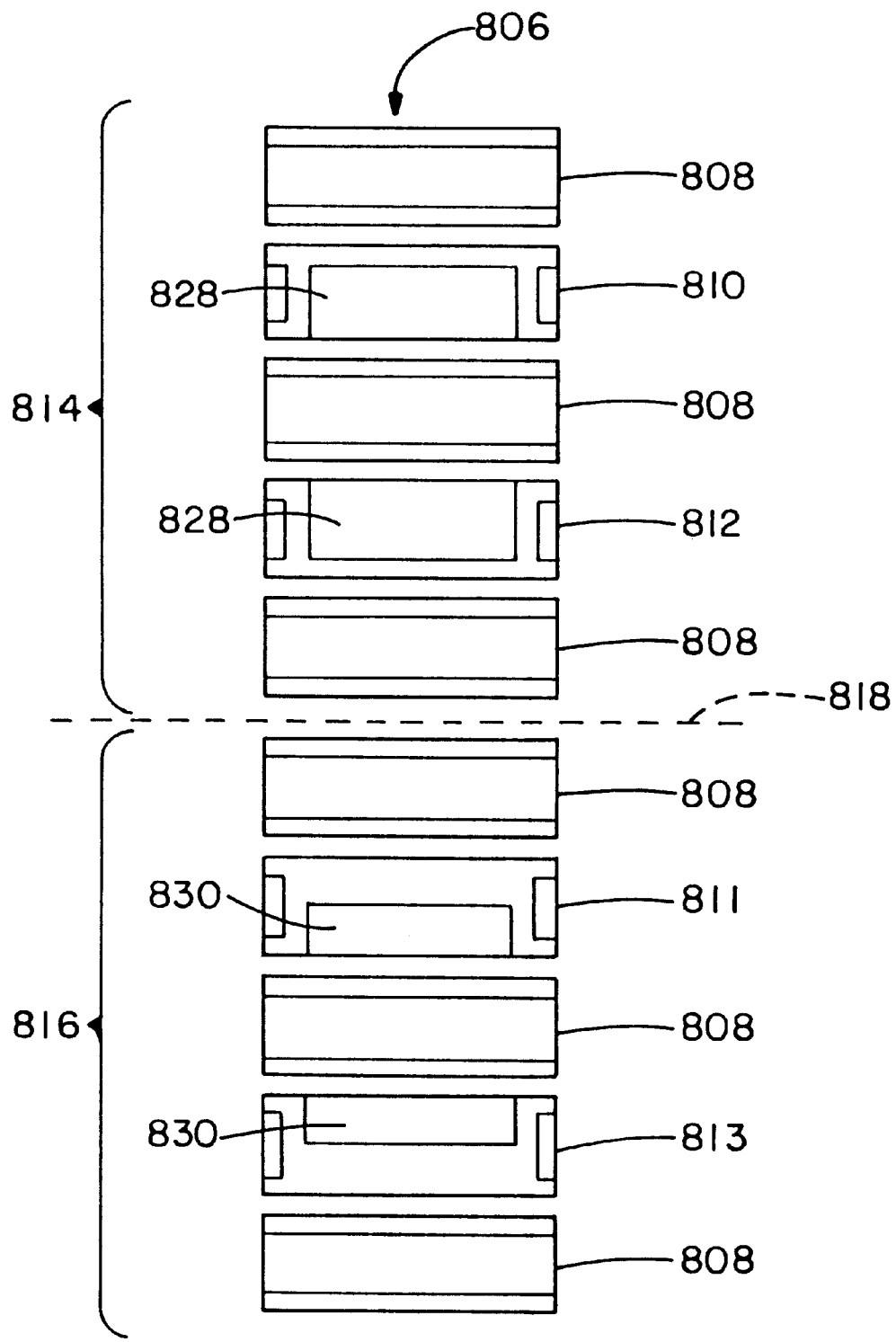
FIG. 38 is an exploded view of the individual internal layers which makeup multi-component filter wherein each internal layer shown is a bottom plan view of the layer.

FIGS. 38 through 40 takes the component stacking shown in FIGS. 23 and 24 one step further by stacking two or more differential and common mode filters within a single component package. Multi-component filter 806, shown in FIG. 38, is configured in the same manner as the numerous other embodiments of the present invention except that the number of plates is doubled, tripled or multiplied by the number of components being stacked within a single component package. FIG. 38 shows the various plates which make up first and second filters 814 and 816 of multi-component filter 806 with the point of division between the two filters shown by dashed line 818. Both the first and second filters 814 and 816 are constructed in a similar manner. Each filter is comprised of a plurality of common ground conductive plates 808 with different first and second electrode plates, 810 and 812 for filter 814 and 811 and 813 for filter 816, sandwiched in between the various common ground conductive plates 808. Each of the common ground conductive plates 808 and the first and second electrode plates, 810 through 812, are imprinted or etched upon a support material having predetermined electrical properties using various techniques known in the art. When the various layers are stacked additional material having predetermined electrical properties (not shown) is disposed between and electrically isolates the various ground and electrode plates from one another.

As shown in FIG. 39, the result of internally stacking first and second filters 814 and 816 is that two or more differential and common mode filters are coupled in parallel. Multi-component filter 806, shown in FIGS. 39 and 40, is made up of first and second filters 814 and 816 with the first electrode plates of each filter, 810 and 811, commonly coupled to first differential conductive band 822, the second electrode plates of each filter, 812 and 813, commonly coupled to second differential conductive band 824 and all of the various common ground conductive plates commonly coupled to common ground conductive band 820. FIG. 40 shows an isometric view of a standard surface mount component package in which multi-component filter 806 is enclosed within. The package is covered by insulated outer casing 826 except for the various conductive bands used for electrically coupling filter 806 with external circuitry.

While only two filters are shown internally stacked within a single component package, Applicant contemplates additional components being internally stacked and does not intend to be limited to the embodiment shown in FIGS. 38 through 40. One particular application of the internal stacking technology is in the combination of a high capacitance filter coupled with a low capacitance filter which results in a broad band filter having improved filter performance across a broader frequency range. Referring to FIG. 38, first and second differential plates 811 and 813 of second filter 816 include smaller conductive surfaces 830 than the conductive surfaces 828 found in first filter 814. By varying the size of the conductive surfaces of the first and second differential plates, actual capacitance values of the filters can be varied. Multi-component filter 806 is the combination of high capacitance filter 814 and low capacitance filter 816 with the combination providing a single multi-component filter 806 providing the benefits of a high capacitance filter with improved high frequency performance.

FIG. 25 discloses a further alternate application which combines differential and common mode filter 10, as shown in FIG. 1, coupled with two MOV electrode plates 700, one on top 820 of filter 10 and one on bottom 822 of filter 10, to form a filter which combines differential and common mode surge protection and capacitive filtering as shown with reference to FIG. 23. The combination as shown in FIG. 25a provides the further advantage of allowing both filter and MOV components to be combined while the combination allowing for through-hole coupling of electrical conductors 12a and 12b. The embodiment shown in FIG. 23 did not require separate MOVs because it was configured for surface mount technology in accordance with the present invention. The embodiment shown in FIG. 25a is necessary because MOV components having through-hole coupling apertures are generally not available due to the detrimental effect the apertures have on the overall operating and cost characteristics of the MOVs. To allow for electrical coupling of MOVs 700 to the electrode plates internal to differential and common mode filter 10, shown in FIG. 1, several surface modifications to filter 10 are necessary. The top 820 and bottom 822 of differential and common mode filter 10 have been modified, as shown in FIG. 25c, to replace one insulating aperture 18 with through-hole plated coupling aperture 718. Through-hole plated coupling aperture 718 of top 820 and bottom 822 are positioned so that each corresponds with opposite electrical conductors 12a or 12b. Although not shown, each through-hole plated coupling aperture 718 is electrically connected to one of the two electrode plates embedded within differential and common mode filter 10 thereby allowing electrical connection of electrical conductors 12a and 12b to the respective electrode plates which form a line-to-line differential capacitor between conductors 12a and 12b. To allow for coupling of MOV 700 to the top and bottom of differential and common mode filter 10, through-hole plated coupling aperture 718 includes strip 824 of conductive material to which one of the two contacts of each MOV 700 is electrically connected. Each MOV 700 includes two terminals 828 and 830 to which MOV 700 electrically couples to other circuits. As shown in FIG. 25a, terminals 830 of both MOVs 700 are physically and electrically coupled to conductive surface 826 of differential and common mode filter 10 through standard means such as application of solder 710. Conductive surface 826 of differential and common mode filter 10 is electrically coupled to common ground conductive plates 14 as shown in FIG. 1. Terminals 828 of each MOV 700 are physically and electrically coupled by solder 710 to conductive strip 824 which connects terminals 828 with the respective electrical conductor 12a and 12b which in turn is connected to the internal electrode plates of differential and common mode filter 10. The result is shown in FIG. 25b and consists of the combination of differential and common mode MOV surge protection in parallel with differential and common mode capacitive filtering between terminals 716a and 716b to which electrical conductors 12a and 12b are electrically coupled.

FIGS. 29 and 30 show a further alternative multi-component surface mount differential and common mode filter designed to provide a strip of filters for varied use. This specific design is for use with multi conductor electronic connectors. As in other embodiments of the present invention, strip filter 642 is comprised of a plurality of common ground conductive plates 656 with first and second electrode plates 662 and 664 sandwiched in between the various common ground conductive plates 656. Strip filter 642, shown in FIG. 29, has four sets of differential and common mode filters. Each common ground conductive plate 656 is etched upon support material 616 having predetermined electrical properties, as disclosed throughout the specification, so that portions of material 616 act as insulation on either side of each common ground conductive plate 656 with only ground extensions 660 extending to the edges of support material 616. The various first and second electrode plates 662 and 664 are also formed on strips of support material 616 so that each electrode plate is surrounded by material 616 except for electrode extensions 666 which extend to the edges of support material 616. As can be seen in FIG. 29, each electrode extension 666 of each first electrode plate 662 extends in an opposite direction from the electrode extension 666 of the corresponding second electrode plate 664. The arrangement of ground extensions 660 and electrode extensions 666 can be reconfigured in numerous patterns as long as a convenient layout for electrical conductor coupling is created. As in the various other embodiments of the present invention, each differential and common mode filter included in strip filter 642 consists of a first and second electrode plate 662 and 664 sandwiched between common ground conductive plates 656 with additional material having predetermined electrical properties (not shown) disposed between and electrically isolating the various ground and electrode plates from one another. FIG. 30 shows top, bottom and side views of strip filter 642 having first and second differential conductive bands 652 and 654 running perpendicular to the lengths of support material 616 and slightly overlapping onto the top of strip filter 642, as shown in FIG. 30*a*. The bottom of strip filter 642, as shown in FIG. 30*d*, is the same as the top to allow for surface mounting of strip filter 642. Common ground conductive bands 650 extend vertically up the ends and onto the top and bottom of strip filter 642, as indicated by the portions labeled 650 in FIGS. 30*a* and 30*d*. Additional common ground conductive bands 650 are also found on the top and bottom of strip filter 642 but in this configuration they do not extend down the sides. First and second differential conductive bands 652 and 654 extend down the corresponding sides of strip filter 642 allowing the various electrode extensions 666 of each of the first and second electrode plates 662 and 664 to electrically couple to their respective conductive bands thereby allowing connection of external electrical conductors to the various internal electrode plates of strip filter 642. For purposes of clarity, the corresponding first and second electrode plates 662 and 664 and first and second differential conductive bands 652 and 654 include suffix designations (a) through (d) which represents each of the four differential and common mode filters included within strip filter 642. FIG. 31 is a further example of strip filter 642 which includes an additional first electrode plate 662*e*. By adding an additional electrode plate strip filter 642 can now accomodate an odd number of electrical conductors. An example of an application requiring an odd number of electrical conductors is providing filtering for D-sub connectors which typically have 9 or 15 conductors. While not shown, the only difference in the top, bottom and side views of strip filter 642, shown in FIG. 31, is that an additional conductive band 652 and one or more common ground conductive bands 650 would be added to accomodate the coupling of the additional conductors. By adding first electrode plate 662*e* without a corresponding second electrode plate, electrode plate 662*e* forms a line-to-ground capacitor between itself and the plurality of common ground conductive plates 656. Although a corresponding second electrode plate to first electrode plate 662*e* is missing, differential and common mode filtering still takes place between the electrical conductor that is connected to first electrode plate 662*e* and any one of the electrical conductors coupled to second electrode plates 664*a–d*.

FIGS. 32 through 37 show a number of variations of the multi-component surface mount differential and common mode strip filters shown in FIGS. 29 through 31. Referring to FIGS. 32 and 33, strip filter 800 is comprised of a plurality of common ground conductive plates 656 with first and second electrode plates 662 and 664 sandwiched in between the various common ground conductive plates 656. As in the previous embodiments, strip filter 800 has four pairs of contacts for the same differential and common mode filter, 1A, 4A, 5A and 8A for electrode plate 662 and 2B, 3B, 6B and 7B for electrode plate 664. Each common ground conductive plate 656 is etched upon support material 616 having predetermined electrical properties, as disclosed throughout this specification, so that portions of material 616 act as insulation on either side of each common ground conductive plate 656. Unlike the embodiments shown in FIGS. 29 through 31, each of the common ground conductive plates 656 has portions of materials 616 extending lengthwise on either side of common ground conductive plate 656. The first and second electrode plates 662 and 664 are also formed on strips of support material 616 so that the electrode plates are surrounded by material 616 except for electrode extensions 666 which extend to the edges of support material 616. Additional material having predetermined electrical properties (not shown) is disposed between and electrically isolates the various common ground conductive plates 656 and electrode plates 662 and 664, all from one another. Strip filter 800 is advantageous in that it provides greater connection versatility with low inductance.

Figure 33A:
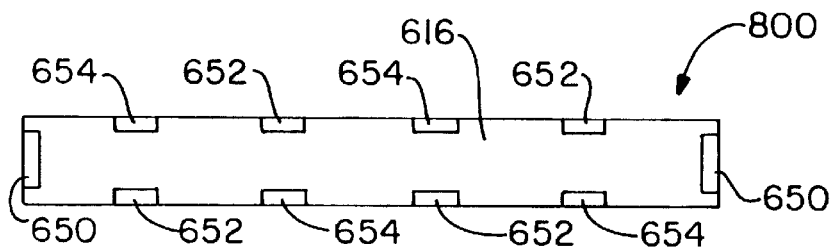
FIG. 33a is a top plan view.
Figure 33B:
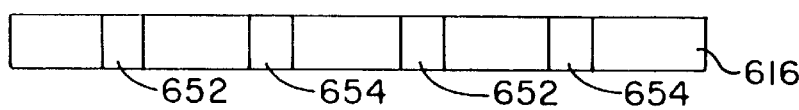
FIG. 33b is front side elevational view.
Figure 33C:
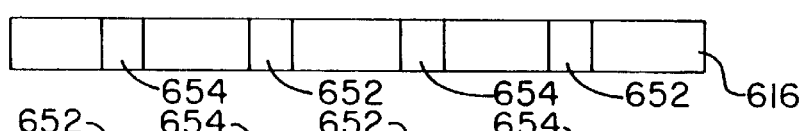
FIG. 33c is a back side elevational view.
Figure 33D:
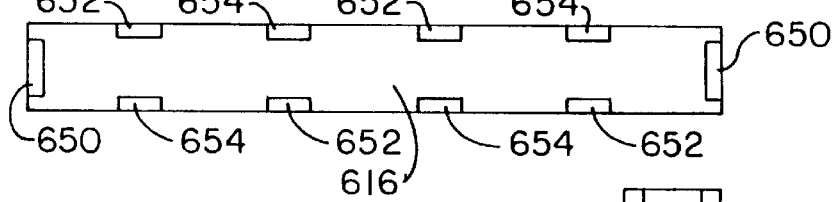
FIG. 33d is a bottom plan view and FIG. 33e is an end elevational view.
Figure 33E:
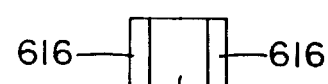

FIG. 33 shows top, bottom and side views of strip filter 800 having first and second differential conductive bands 652 and 654 running perpendicular to the lengths of support material 616 and slightly overlapping onto the top of strip filter 800, as shown in FIG. 33*a*. The bottom of strip filter 800, as shown in FIG. 33*d*, is the same as the top to allow for surface mounting of strip filter 800. Common ground conductive bands 650 extend vertically up the ends and onto the top and bottom of strip filter 800, as shown in FIGS. 33*a*, 33*d* and 33*e*. First and second differential conductive bands 652 and 654 extend down the corresponding sides of strip filter 800 allowing the various electrode extensions 666 of each of the first and second electrode plates 662 and 664 to electrically couple to their respective conductive bands thereby allowing connection of external electrical conductors to the first and second internal electrode plates.

Figure 34:
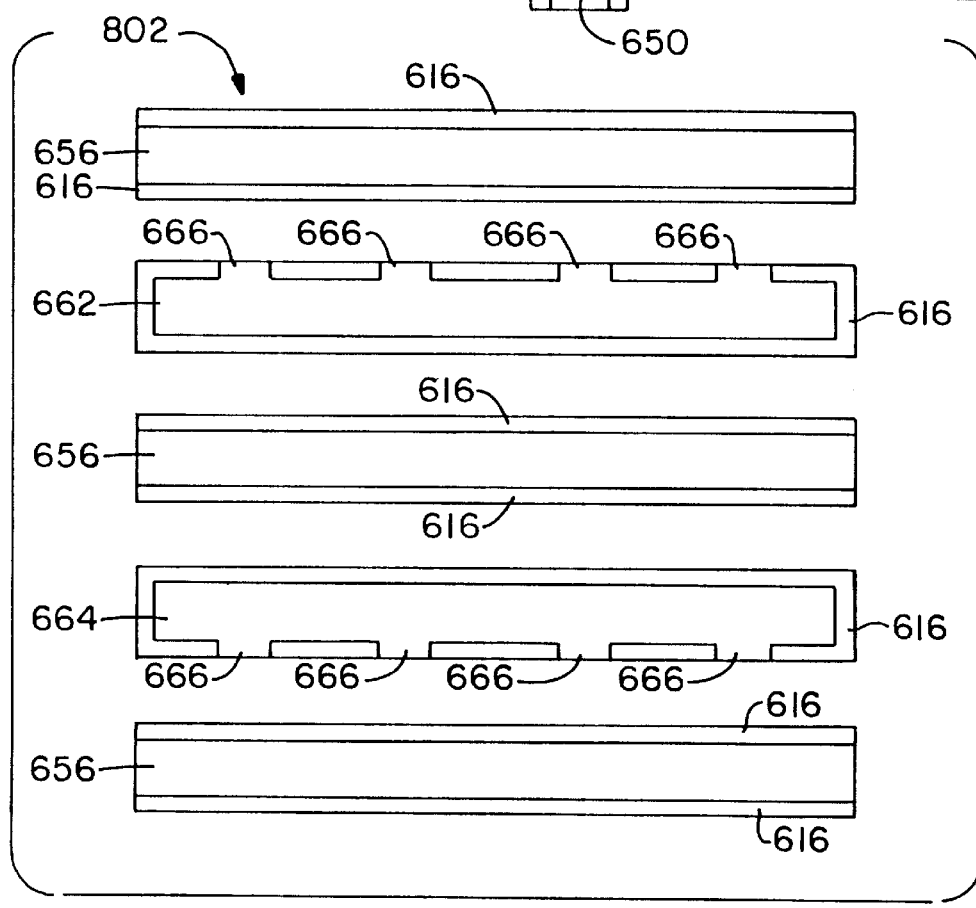
FIG. 34 is an exploded view of the individual internal layers which makeup an alternative multi-component strip filter wherein each internal layer shown is a bottom plan view of the layer.
Figure 37A:
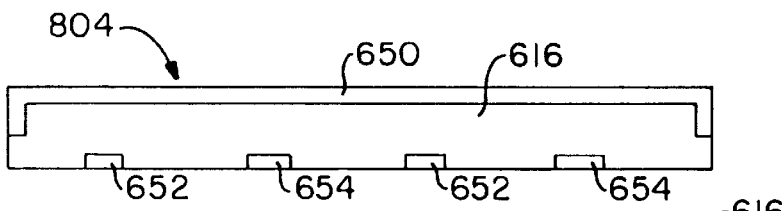
FIG. 37a is a top plan view.
Figure 37B:
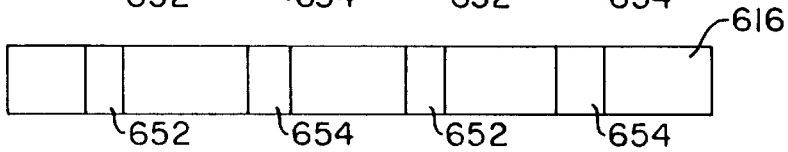
FIG. 37b is front side elevational view.
Figure 37C:
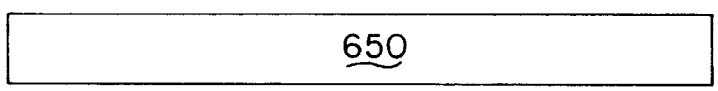
FIG. 37c is a back side elevational view.
Figure 37D:
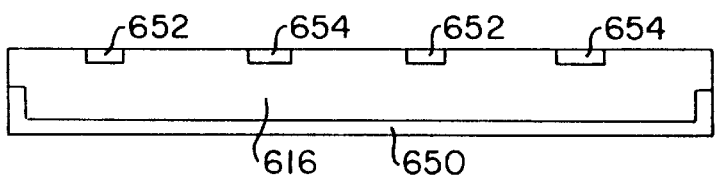
FIG. 37d is a bottom plan view and FIG. 37e is an end elevational view.
Figure 37E:
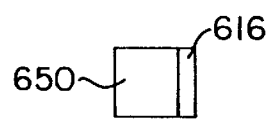

FIGS. 34 and 35 show a further embodiment of the present invention in strip filter 802 with the only difference being the actual configuration and orientation of the various electrode extensions 666 of each of the first and second electrode plates 662 and 664. As clearly shown in FIGS. 32 through 35, the connection or pinout configurations of the strip filters can be arranged to suit any application. Strip filter 804, as shown in FIGS. 36 and 37, is a further embodiment which emphasizes the common ground connection. Referring to FIG. 36, each common ground conductive plate 656 is imprinted or etched upon support material 616 having predetermined electrical properties through techniques known in the art, so that an elongated strip of material 616 acts as insulation along one side of each common ground conductive plate 656. The first and second electrode plates 662 and 664 are essentially the same as in the previous embodiments except that electrode extension 666 of both the first and second electrode plates 662 and 664 extend from the same side of the electrode plates as the insulation strips 616 extend on each the common ground conductive plates 656. FIG. 37 shows top, bottom, side and end views of strip filter 804 having first and second differential conductive bands 652 and 654 running perpendicular to the lengths of support material 616 and slightly overlapping onto the top of strip filter 804, as shown in FIG. 37a. The bottom of strip filter 804, as shown in FIG. 37d, is the same as the top to allow for surface mounting of strip filter 804. In this embodiment, common ground conductive band 650 extends vertically up the ends and onto the top and bottom of strip filter 804 and entirely encompasses one side of strip filter 804, as shown in FIG. 37c. As with the first and second differential conductive bands 652 and 654, the common ground conductive band 650 also extends onto the top and bottom of strip filter 804 along the full length of the covered side. The configuration of strip filter 804 is particularly useful in applications requiring a large ground plane which acts as a shield and is capable of absorbing and dissipating greater amounts of heat and electromagnetic interference.

Figure 15:
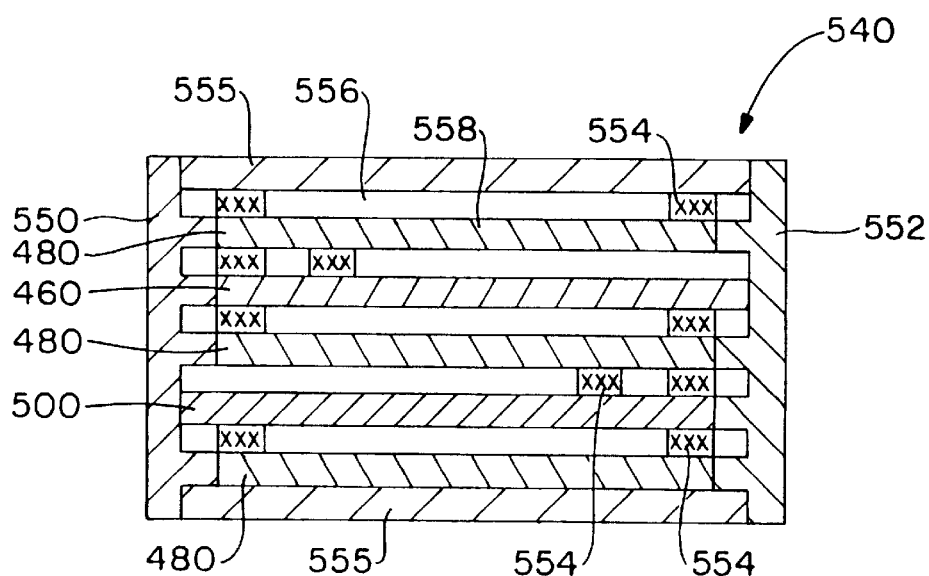
FIG. 15 shows a front elevational view in cross-section of the film plates of FIG. 14 in operable cooperation.
Figure 14:
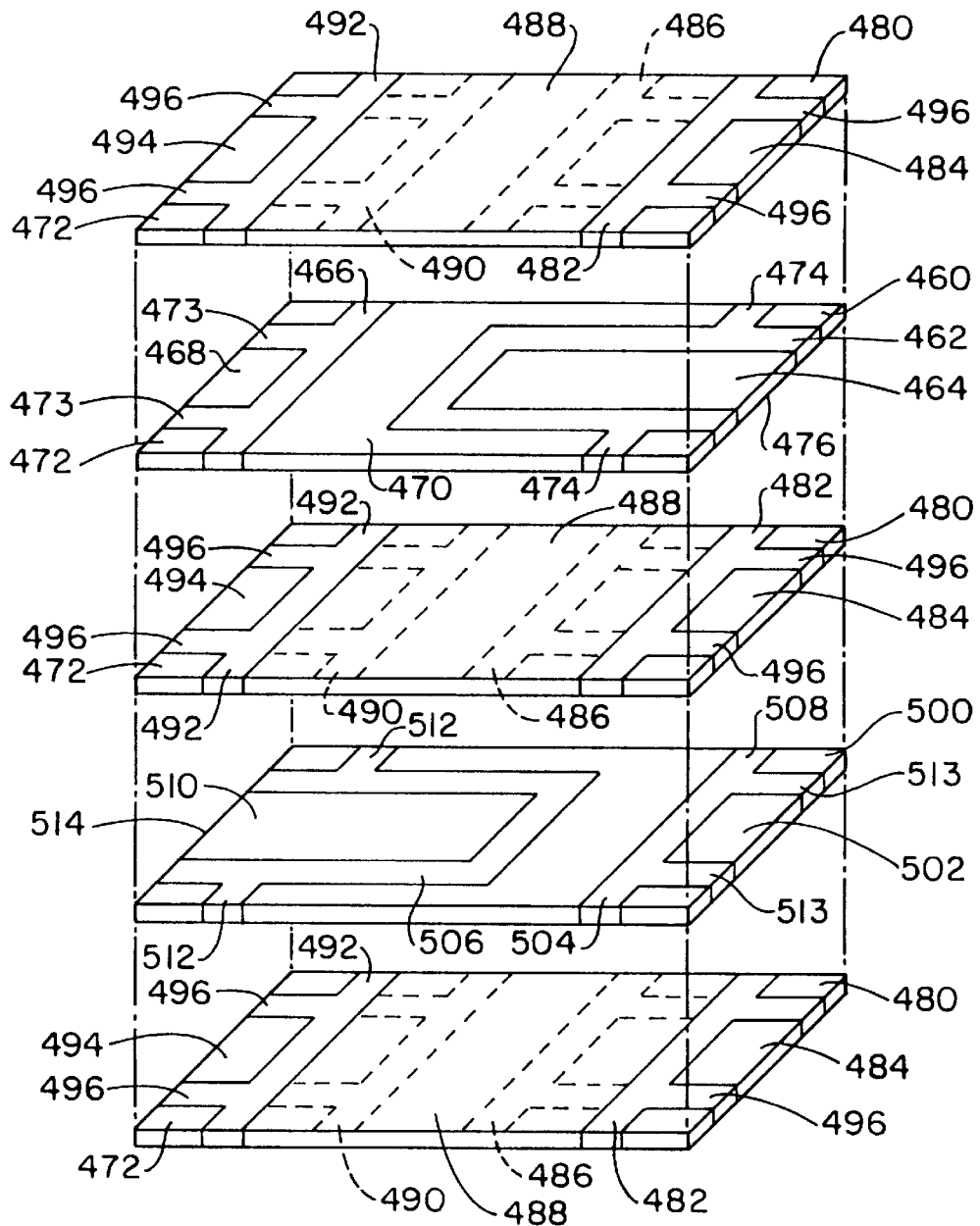
FIG. 14 is an exploded perspective view of the individual film plates which comprise a further embodiment of a differential and common mode filter.

FIGS. 14 and 15 disclose a further embodiment of a differential and common mode filter formed on a film or Mylar-like medium. This embodiment is comprised of a film medium and consists of a common ground conductive plate 480 followed by the first electrode differential plate 460, then another common ground conductive plate 480 and second electrode differential plate 500, then another common ground conductive plate 480. Each plate is essentially comprised of film 472, which itself may be comprised of a number of materials such as but not limited to Mylar, wherein film 472 is completely metallized on one side creating a metallized plate. Using lasers, portions of metallized material are removed (demetallized) in predetermined patterns to create isolation barriers. First differential plate 460 has two laser edged isolation barriers 462 and 466, which divide first differential plate 460 into three conductive areas: electrode 464, isolated electrode 468 and common electrode 470. Second differential plate 500 is identical to first differential plate 460 in that it has two isolation barriers 506 and 504 which divide second differential plate 500 into three conductive areas: electrode 510, isolated electrode 502 and common electrode 508. For both first and second differential plates 460 and 500, isolation barriers 462 and 506 are essentially U-shaped to create electrodes 464 and 510 which encompass a large area of first and second plates 460 and 500. U-shaped isolation barriers 462 and 506 allow electrode 464 and 510 to extend fully to ends 476 and 514, respectively. Extending from isolation barrier 462 and 506 are members 474 and 512 and extending from isolation barriers 466 and 504 are members 473 and 513. Members 474 and 512 extend perpendicular to and outward from the ends of u-shaped isolation barriers 462 and 506 at their points nearest ends 476 and 514 and members 473 and 513 extend perpendicular to and outward from isolation barriers 466 and 504 respectively in order to fully isolate common electrodes 470 and 508 from ends 476 and 514. Also, both first and second differential plates 460 and 480 have isolated electrodes 468 and 502 formed on opposite of ends 476 and 514 by isolation barriers 466 and 504.

Common ground conductive plate 480 includes isolation barriers 482 and 492 which divide common ground conductive plate 480 into three conductive surfaces: common electrode 488, isolated electrode 484 and isolated electrode 494. As shown, isolation barriers 482 and 492 run vertically adjacent to and in parallel with the right and left edges of common ground conductive plate 480. Both isolation barriers 482 and 492 also include members 496 extending outward and perpendicular from the vertical sections of isolation barriers 482 and 492 and are positioned so when plates 460, 480 and 500 are stacked, they are aligned with the horizontal portions of the U-shaped isolation barriers 462 and 506 of first and second differential plates 460 and 500.

An additional feature is that common ground conductive plate 480 can be optimized for use in filtering AC or DC signals. Isolation barriers 492 and 482 as described above are optimized for use in filtering DC signals. For DC operation isolated electrodes 484 and 494 require very little area within common ground conductive plate 480. When the filter is comprised of a film medium and used for filtering AC signals, isolated electrodes 484 and 494 require a greater area which is accomplished by etching modified isolation barriers 486 and 490. The vertically running isolation barriers 484 and 494 are etched closer together and closer to the center of common ground conductive plate 480. To accommodate this modification, members 496 extending outward and perpendicular from the vertical sections are longer than for the DC version. The greater area isolated electrodes 484 and 494 provide better AC filtering characteristics, although either configuration provides filtering to both types of current.

FIG. 15 is a cross-section of film medium differential and common mode filter 540 comprised of a plurality of plates similar to those shown in FIG. 14. As for the surface mount chip embodiment shown in FIG. 11, film differential and common mode filter 540 can also consist of more than five plates in effect coupling capacitors in parallel to increase overall capacitance.

The top and bottom of filter 540 consist of protective cover layers 555. Situated below the top protective cover layer 555 is common ground conductive plate 480, followed by an electrode plate 460, followed by another common ground conductor plate 480, followed by the next electrode plate 500 and then another common ground conductive plate 480. The previous sequence of alternating ground and electrode plates can be repeated to achieve additional capacitance. Shown in cross section each layer or plate is comprised of a film 558 possessing a conductive metalized upper surface 556 which have isolation patterns cut into the metal surface with a laser creating isolation patterns 554. Terminal conductive blocks 550 and 552 are comprised of pure aluminum which is deposited on the edges and penetrates into the film extensions to provide a highly conductive termination consisting of like metals. The extensions described are created by stacking the different plates in a sequence that has every electrode plate 460 or 500 surrounded by common ground conductive plates 480 as pictured in FIG. 15. The electrode plates 460 and 500 are offset from each other and the common ground conductive plates to facilitate edge termination.

FIGS. 16 through 19 are directed towards embodiments of the differential and common mode filter configured and optimized for use with electric motors. Electric motors are a tremendous source of electromagnetic emissions. This fact is evident even to layman, as most people have experienced running a vacuum cleaner in front of an operating television set and noticing "snow" fill the screen. This interference with the television is due to the electromagnetic emissions from the motor. Vacuum cleaners are by no means the only source of electromagnetic emissions. Electric motors are used extensively in a number of home appliances such as washing machines, dryers, dishwashers, blenders, hair dryers. In addition, most automobiles contain a number of electric motors to control the windshield wipers, electric windows, electric adjustable mirrors, retractable antennas and a whole host of other functions. Due to the prevalence of electric motors and increased electromagnetic emissions standards there is a need for differential and common mode filtering.

Electric motor filter 180 may be made in any number of shapes but in the preferred embodiment shown in FIG. 16 it is essentially a rectangular block comprised of material 182 having one of a number of predetermined electrical properties. FIG. 16a shows the outer construction of filter 180 which consists of a rectangular block of material 182 having an insulated shaft aperture 188 disposed through filter 180's center, conductive bands 184 and 194 and common conductive bands 186. FIG. 16b shows a side view of filter 180 with the arrangement of conductive bands 184 and 194 and common conductive band 186 being electrically and physically isolated from one another by sections of material 182 positioned between the various bands. FIG. 16c shows a cross section along line A of FIG. 16a. As in all previous embodiments, the physical architecture of the present invention is comprised of conductive electrodes 181 and 185 with common conductive electrode 183 sandwiched in between. Material 182 having predetermined electrical properties is interspersed between all of the electrodes to prevent electrical connection between the various conductive electrodes 181 and 185 and common conductive electrode 183. Similar to that of the surface mount embodiments of the present invention, filter 180 employs conductive bands 184 and 194 to electrically connect filter 180's internal electrodes to electrical conductors. Conductive electrode 181 extends fully to and comes in contact with conductive band 184 to provide the electrical interface required. As shown in FIG. 16c, conductive electrode 181 does not extend fully to come in contact with conductive band 194 which is coupled to conductive electrode 185. Although not shown, common conductive electrode 183 extends fully between common conductive bands 186 without coming in contact with conductive bands 184 and 194. Again, by coupling common conductive bands 186 to signal or earth ground, a "true" ground may be employed rather than the inherent ground provided by common conductive electrode 183.

FIG. 16d is a schematic representation of differential and common mode electric motor filter 180 showing conductive electrodes 181 and 185 providing the two necessary parallel plates for a line-to-line differential mode coupling capacitor while at the same time working in conjunction with common conductive electrode 183 to provide line-to-ground common mode decoupling capacitors with common conductive electrode 183 acting as the inherent ground. Also shown are conductive bands 184, 194 and common conductive band 186 which allow electric motor filter 180 to be connected to external electrical conductors. While the preferred embodiment of FIG. 16 only shows one common conductive electrode 183 and two conductive electrodes 181 and 185, Applicant contemplates the use of a plurality of electrodes to obtain varying capacitance values through the additive effect of parallel capacitance similar to that described for previous embodiments.

FIG. 17 shows differential and common mode electric motor filter 180 electrically and physically coupled to electric motor 200. As shown in FIG. 17a, electric motor filter 180 is placed on top of electric motor 200 having motor shaft 202 extending outward therefrom. Motor shaft 202 is disposed through shaft aperture 188 of filter 180 with conductive bands 184 and 194 electrically coupled to connection terminals 196, which are isolated from one another and the rotor of electric motor 200. The individual connection terminals 196, although not shown, are then electrically connected to electrical supply lines providing electric motor 200 with power. Once electric motor filter 180 is connected/coupled to electric motor 200, motor face plate 208 is placed on top of both motor 200 and filter 180 with motor shaft 202 disposed through a similar aperture in the center of motor face plate 208. Face plate 208 is then physically coupled to the body of motor 200 through the use of clamps 206. While not shown, filter 180 may be used with its inherent ground by coupling common conductive bands 186 to the motors enclosure or common conductive bands 186 may be directly wired to circuit or earth ground.

Figure 18:
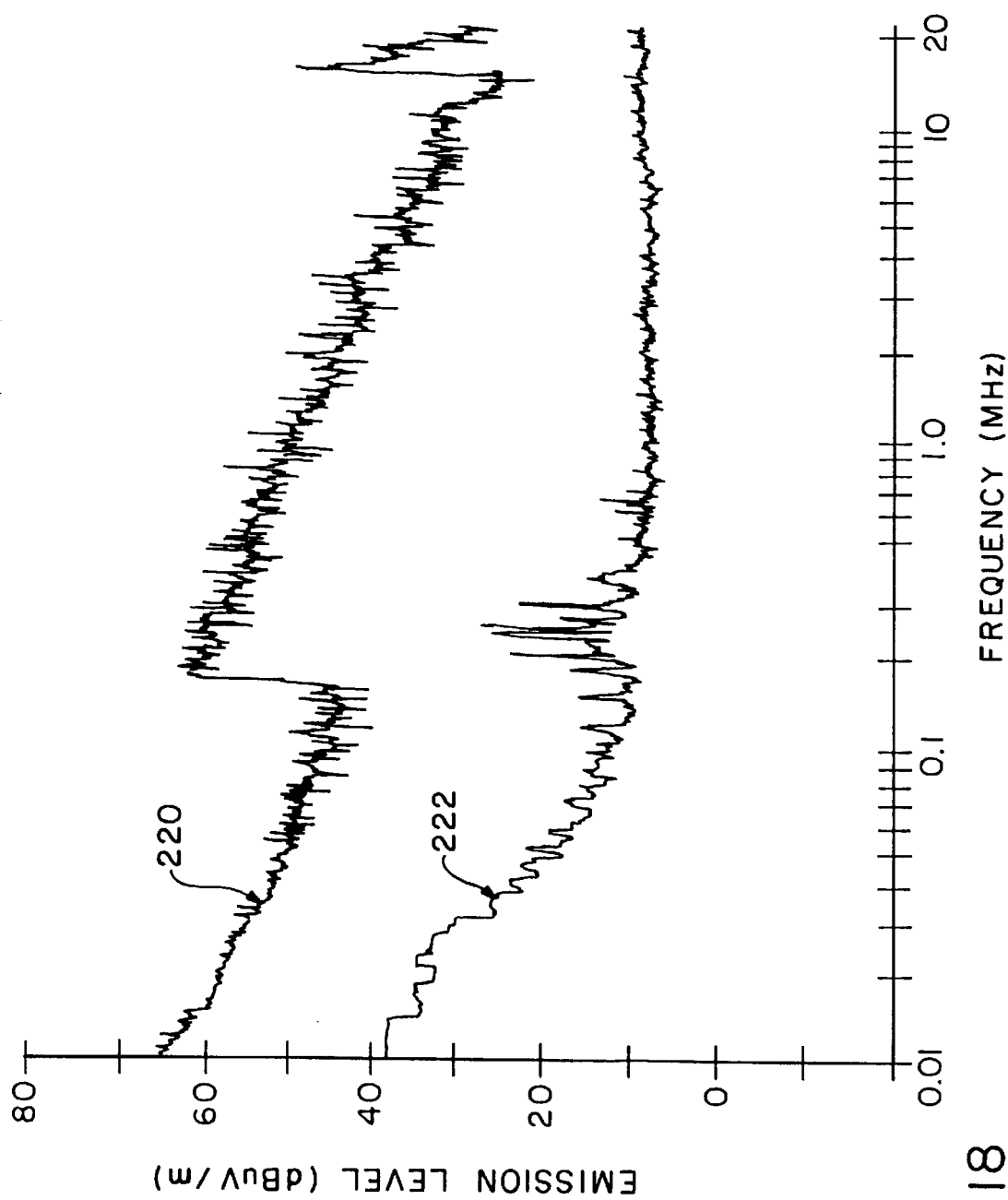
FIG. 18 is a logarithmic graph showing a comparison of the emission levels in dBuV/m as a function of frequency for an electric motor with a standard filter and an electric motor with the differential and common mode filter of FIG. 17.

FIG. 18 is a logarithmic graph showing a comparison of electric motor 200's electromagnetic emission levels as a function of frequency with the result of an electric motor having a standard filter being shown at 220 and the results of differential and common mode electric motor filter 180 shown at 222. The graph demonstrates that between 0.01 MHz and approximately 10 MHz there is a minimum of a 20 dB suppression of electromagnetic emissions throughout the range with even more pronounced decreases in the 0.1 to 1 MHz range. One can see that at the upper frequency range of 10–20 MHz and beyond, the decrease in electromagnetic emissions is not as great as at the lower frequencies but this is not particularly critical as most electric motors operate well below this frequency range thereby allowing electric motor filter 180 to provide enhanced performance with decreased electromagnetic emissions for the majority of applications.

Differential and common mode electric motor filter 230 shown in FIG. 19 is a further embodiment of the filter of FIG. 16. The multi-plate embodiment of FIG. 19 is almost identical to the filter embodiment shown and described in FIG. 1 with the exceptions being the shapes of the plurality of plates and that each plate includes motor shaft aperture 242 to allow the plurality of plates and filter 230 itself to be coupled with the top of an electric motor without interfering with the motor shaft and its rotation. FIG. 19a shows the individual plates of filter 230 which include common ground conductive plate 232 and a plurality of conductive plates 246 with all three plates having motor shaft apertures 242. Common ground conductive plate 232 is comprised of a conductive material and in the preferred embodiment is fabricated from a piece of metal. All three plates have at least two apertures 252 which accept electrical conductors 244 as shown in FIG. 19b. The two conductive plates 246 of FIG. 19a show opposite sides of plate 246. As in the other embodiments already described, conductive plates 246 are fabricated of material 254 having predetermined electrical properties wherein one side of plate 246 is covered by a conductive surface 236 with the other side of plate 246 having a non-conductive surface 234. To provide electrical coupling between each electrical conductor 244 and the appropriate conductive surface 236 of each conductive plate 246, one of the two apertures 252 is a coupling aperture 240 while the other aperture 252 is surrounded by an insulating ring 238. Both apertures 252 within common ground conductive plate 232 are surrounded by insulating rings 238 to prevent any electrical connection between common ground conductive plate 232 and either electrical conductor 244.

FIG. 19b shows the operative physical coupling of common ground conductive plate 232 and conductive plates 246. Common ground conductive plate 232 is sandwiched between conductive plates 246 in such a way that non-conductive surface 234 of each conductive plate 246 is facing and comes in contact with one of the two sides of common ground conductive plate 232. Conductive plates 246 are also arranged so that insulating rings 238 of each plate 246 are positioned so only one of the two electrical conductors 244 is coupled to either conductive surface 236 of conductive plates 246. Once common ground conductive plate 232 and the plurality of conductive plates 246 are physically coupled the entire arrangement which makes up differential and common mode electric motor filter 230 is then placed over the top of an electric motor with the motor shaft extending through shaft apertures 242 of each of the plates.

FIG. 19c is a schematic representation of the filter components showing how the individual conductive surfaces of the plurality of plates interact to form the line-to-line and line-to-ground capacitors which form filter 230. Because the plurality of conductive plates 246 are essentially identical and are just arranged differently with respect to common ground conductive plate 232, the schematic shown in FIG. 19c uses prime reference numerals to indicate conductive surfaces 236 of the individual conductive plates 246.

FIGS. 20 and 21 show a high-power embodiment of the differential and common mode filter of the present invention. FIG. 20a shows a quasi-schematic representation of the physical arrangement of plates which make up the filter shown in FIG. 20b. Referring to both FIGS. 20a and 20b it can be seen that common ground conductive plate 292 is again sandwiched between two conductive electrode plates, 270 and 270', which are individually connected/coupled to electrical conductors 275a and 275b. Each conductive electrode plate, 270 and 270', consists of a material 264 having specific predetermined properties, with each plate then having a conductive surface to which electrical connections are made. After electrical conductors 275a and 275b are connected to conductive electrode plates 270 and 270', the conductive surface is coated with insulation. Conductive electrode plates 270 and 270' are physically coupled to common ground conductive plate 292 via typical adhesive material known in the art. A clearer representation of high-power differential and common mode filter 260 is shown in FIG. 21 with FIG. 21a showing the physical embodiment and FIG. 21b showing a representative schematic. Filter 260, as shown in FIG. 21a, is comprised of common ground conductive plate 262 sandwiched between wheels of material 264 having predetermined electrical properties. Wheels 264 of material are held in place by conductive electrodes 270 and 270' with coupling axle 278 disposed through the plurality of apertures 266, not shown, and disposed through wheels 264 and common ground conductive plate 262. To manage the higher current and voltage conditions filter 260 is designed for, common ground conductive plate 262, conductive plates 270 and 270' and wheels of material 264 are typically sized much larger than previous embodiments of the present invention. To allow filter 260 to be connected to external electrical conductors, conductive electrodes 270 have connecting members 284 extending therefrom which are mechanically coupled to connection terminals 275a and 275b through common means such as tightening screws and washers. Connection terminals 275a and 275b are mounted on top of enclosure lid 282 to create a one piece assembly consisting of enclosure lid 282, common ground conductive plate 262, conductive electrodes 270 and 270' and wheels 264 of material. This single component is then placed within component enclosure 276 which has flanges 272 extending from common ground conductive plate 262 coupled to enclosure mounting holes 280. This arrangement provides a means of coupling the inherent ground provided by common ground conductive plate 262 to circuit or earth ground if desired. FIG. 21b shows the relationship of the different physical components of FIG. 21a that make up filter 260 schematically represented. As in all other embodiments of the present invention, conductive electrodes 270, represented with and without a prime to indicate separate surfaces, make up the two parallel plates necessary for a line-to-line capacitor coupled between connection terminals 274. Conductive electrodes 270 individually but in conjunction with common conductive electrode 262 make up line-to-ground common mode decoupling capacitors with common conductive electrode 262 acting as the inherent ground.

As can be seen, many different applications of the differential and common mode filter architecture are possible and review of several features universal to all the embodiments must be noted. First, the material having predetermined electrical properties may be one of a number in any of the embodiments including but not limited to dielectric material, metal oxide varistor material, ferrite material and other more exotic substances such as Mylar film or sintered polycrystalline. No matter which material is used, the combination of common ground conductive plates and electrode conductive plates creates a plurality of capacitors to form a line-to-line differential coupling capacitor between and two line-to-ground decoupling capacitors from a pair of electrical conductors. The material having electrical properties will vary the capacitance values and/or add additional features such as over-voltage and surge protection or increased inductance, resistance, or a combination of all the above.

Second, in all embodiments whether shown or not, the number of plates, both common conductive and electrode, can be multiplied to create a number of capacitive elements in parallel which thereby add to create increased capacitance values.

Third, additional common ground conductive plates surrounding the combination of a center conductive plate and a plurality of conductive electrodes may be employed to provide an increased inherent ground and surge dissipation area and a true Faraday shield in all embodiments. Additional common ground conductive plates can be employed with any of the embodiments shown and is fully contemplated by Applicant.

Finally, from a review of the numerous embodiments it should be apparent that the shape, thickness or size may be varied depending on the electrical characteristics desired or upon the application in which the filter is to be used due to the physical architecture derived from the arrangement of common ground conductive and conductive electrode plates.

In fact the differential and common mode filter, although not shown, could easily be fabricated in silicon and directly incorporated into integrated circuits for use in such applications as communication chips. The differential and common mode filter would be embedded and filter communication or data lines directly from their circuit board terminal connections, thus reducing circuit board real estate requirements and further reducing overall circuit size while having simpler production requirements. Integrated circuits are already being made having capacitors etched within the silicone foundation which allows the architecture of the present invention to readily be incorporated with technology available today.

Although the principals, preferred embodiments and preferred operation of the present invention have been described in detail herein, this is not to be construed as being limited to the particular illustrative forms disclosed. It will thus become apparent to those skilled in the art that various modifications of the preferred embodiments herein can be made without departing from the spirit or scope of the invention as defined by the appended claims.

What is claimed is:

1. A line conditioning electronic component comprising:
   at least one common ground conductive plate formed upon a support material having predetermined electrical properties;

first and second electrode plates, wherein said first electrode plate is formed upon a first support material having predetermined electrical properties and said second electrode plate is formed upon a second support material having predetermined electrical properties;

wherein said first electrode plate is s tack ed above said at least one common ground conductive plate and said second electrode plate is stacked below said at least one common ground conductive plate, wherein said first electrode plate and said second electrode plate sandwich said at least one center common ground conductive plate;

wherein said support material isolates said common ground conductive plate, said first electrode plate and said second electrode plate preventing direct electrical connection between said plates; and said at least one common ground conductive plate, said first electrode plate, said second electrode plate and said support material form a plurality of differential and common mode filters.

2. A line conditioning electronic component as recited in claim 1, wherein said support material having predetermined electrical properties is selected from the group consisting of dielectric materials, metal oxide varistor materials, ferrite materials, sintered polycrystalline and ferroelectric-ferromagnetic composite materials wherein the particular material will determine the specific performance of both filter and surge protection functions.

3. A line conditioning electronic component as recited in claim 1, further comprising a material having predetermined electrical properties, wherein said material is maintained between said at least one common ground conductive plate and said first and second electrode plates preventing direct electrical connection between said plates.

4. A line conditioning electronic component as recited in claim 1, further comprising a plurality of first differential bands, a plurality of second differential bands and at least one common band;

wherein said first electrode plate is electrically connected to one of said plurality of first differential bands;

wherein said second electrode plate is electrically connected to one of said plurality of second differential bands; and wherein said at least one common ground conductive plate is electrically connected to said at least one common band, thereby forming a capacitive element between said first and second differential bands and two capacitive elements between each of said first and second differential bands and said at least one common band.

5. A line conditioning electronic component as recited in claim 1, further comprising at least two common ground conductive plates, wherein said first common ground conductive plate is stacked above said first electrode plate and said second common ground conductive plate is stacked below said second electrode plate.

6. A line conditioning electronic component as recited in claim 1, wherein said common ground conductive plate extends the full length of said support material.

7. A line conditioning electronic component as recited in claim 5, wherein said center common ground conductive plate and said first and second common ground conductive plates extend the full length of said support material.

8. A line conditioning electronic component as recited in claim 1, wherein said first and second electrode plates include a plurality of electrode extensions which extend perpendicular to the lengthwise orientation of said first and second electrode plates.

9. A line conditioning electronic component as recited in claim 8, wherein a portion of said plurality of electrode extensions extend in one direction perpendicular to the lengthwise orientation of said first and second electrode plates and the remainder of said plurality of electrode extensions extend in an opposite direction perpendicular to the lengthwise orientation of said first and second electrode plates.

10. A line conditioning electronic component as recited in claim 8, wherein said plurality of electrode extensions coupled to said first electrode plate extend in one direction perpendicular to the lengthwise orientation of said first and second electrode plates and said plurality of electrode extensions coupled to said second electrode plate extend in an opposite direction perpendicular to the lengthwise orientation of said first and second electrode plates.

11. A line conditioning electronic component as recited in claim 8, wherein said plurality of electrode extensions coupled to said first and second electrode plates extend in the same direction perpendicular to the lengthwise orientation of said first and second electrode plates.

12. A line conditioning electronic component as recited in claim 4, wherein said at least one common band consist of a first and second common band, wherein said first common band is coupled to one end of said line conditioning electronic component and said second common band is coupled to the opposite end of said line conditioning electronic component.

13. A line conditioning electronic component as recited in claim 11, wherein said at least one common band covers the full length of one side of said line conditioning electronic component and portions of each end of said line conditioning electronic component.

14. A line conditioning electronic assembly comprised of at least a first and second line conditioning electronic component as recited in claim 5, wherein said first and second line conditioning electronic components are stacked upon each other, thereby electrically coupling said first and second line conditioning electronic components in parallel.

15. A line conditioning electronic assembly as recited in claim 11, further comprising first and second differential bands and at least one common band, wherein said first differential band is connected to said first electrode plate of said first and second line conditioning electronic components, said second differential band is connected to said second electrode plate of said first and second line conditioning electronic components and said at least one common band is coupled to each of said common ground conductive plates of said first and second line conditioning electronic components.

16. A line conditioning electronic assembly as recited in claim 15, wherein said first line conditioning electronic component has a higher capacitance value than said second line conditioning electronic component.

17. A line conditioning electronic assembly comprising:
at least two line conditioning electronic components, wherein said at least two line conditioning electronic components are stacked upon each other, thereby electrically coupling said at least two line conditioning electronic components in parallel, and wherein each of said at least two line conditioning electronic components includes:
at least one common ground conductive plate formed upon a support material having predetermined electrical properties;

first and second electrode plates, wherein said first electrode plate is formed upon a first support material having predetermined electrical properties and said second electrode plate is formed upon a second support material having predetermined electrical properties;

wherein said first electrode plate is stacked above said at least one common ground conductive plate and said second electrode plate is stacked below said at least one common ground conductive plate, wherein said first electrode plate and said second electrode plate sandwich said at least one center common ground conductive plate;

wherein said support material isolates said common ground conductive plate, and first electrode plate and said second electrode plate preventing direct electrical connection between said plates; and said at least one common ground conductive plate, said first electrode plate, said second electrode plate and said support material form a plurality of differential and common mode filters.

18. A line conditioning electronic assembly as recited in claim 17, wherein each of said at least two line conditioning electronic components further comprises at least two common ground conductive plates, wherein said at least first common ground conductive plate is stacked above said first electrode plate and said at least second common ground conductive plate is stacked below said second electrode plate.

19. A line conditioning electronic component comprising:

at least one common ground conductive plate;

at least two electrode plates, wherein said first electrode plate is stacked below said common ground conductive plate and said second electrode plate is stacked above said common ground conductive plate; and a material having predetermined electrical properties, wherein said material is maintained between said common ground conductive plate and said at least two electrode plates preventing direct electrical connection between said plates creating at least one capacitive element between said first and second electrode plates and at least two capacitive elements, one between said first electrode plate and said at least one common ground conductive plate and the other between said second electrode plate and said at least one common ground conductive plate.

20. A line conditioning electronic component as recited in claim 19, wherein said at least one capacitive element created between said first and second electrode plates is a line-to-line capacitive element; and wherein said at least two capacitive elements created between said at least two electrode plates and said at least one common ground conductive plate are line-to-ground capacitive elements.

21. A line conditioning electronic component as recited in claim 19, wherein at least one common ground conductive plate is stacked below said first electrode plate and at least one common ground conductive plate is stacked above said second electrode plate, wherein said material having predetermined electrical properties is maintained between said first and second electrode plates and said common ground conductive plates.

22. A line conditioning electronic component as recited in claim 19, wherein said material having predetermined electrical properties is selected from the group consisting of dielectric materials, metal oxide varistor materials, ferrite materials, sintered polycrystalline materials, polymer materials and ferroelectric-ferromagnetic composite materials wherein the particular material will determine the specific filter, decoupling and surge protection performance of said line conditioning electronic component.

23. A line conditioning electronic component as recited in claim 21, wherein said material having predetermined electrical properties is selected from the group consisting of dielectric materials, metal oxide varistor materials, ferrite materials, sintered polycrystalline materials, polymer materials and ferroelectric-ferromagnetic composite materials wherein the particular material will determine the specific filter and surge protection performance of said line conditioning electronic component.

24. A line conditioning electronic component as recited in claim 19, wherein said predetermined electrical property of said material is selected from the group consisting of capacitive filtering, over voltage surge suppression, inductive filtering, and combinations of capacitive, inductive and suppression properties wherein the composition of said material will determine the specific filter, decoupling and surge protection performance of said line conditioning electronic component.

25. A line conditioning electronic component as recited in claim 21, wherein said predetermined electrical property of said material is selected from the group consisting of capacitive filtering, over voltage surge suppression, inductive filtering, and combinations of capacitive, inductive and suppression properties wherein the composition of said material will determine the specific filter, decoupling and surge protection performance of said line conditioning electronic component.

26. A line conditioning electronic component as recited in claim 19, wherein said at least two electrode plates have equal and balanced electrical characteristics which result in line-to-line capacitance values approximately half of the line-to-ground capacitance values for said line conditioning electronic component.

27. A line conditioning electronic component as recited in claim 21, wherein said at least two electrode plates have equal and balanced electrical characteristics which result in line-to-line capacitance values approximately half of the line-to-ground capacitance values for said line conditioning electronic component.

28. A line conditioning electronic component as recited in claim 21, wherein said at least one common ground conductive plate stacked below said first electrode plate and said at least one common ground conductive plate stacked above said second electrode plate create a partial shield encircling said line conditioning electronic component reducing mutual inductive coupling between said at least two electrode plates.

29. A line conditioning electronic component as recited in claim 21, wherein said at least one common ground conductive plate stacked below said first electrode plate and said at least one common ground conductive plate stacked above said second electrode plate create a partial Faraday shield encircling said line conditioning electronic component reducing mutual inductive coupling between said at least two electrode plates.

30. A line conditioning electronic component as recited in claim 19, further comprising a plurality of outer conductive surfaces wherein each of said at least two electrode plates and said at least one common ground conductive plate are individually and independently electrically coupled to separate outer conductive surfaces.

31. A line conditioning electronic component as recited in claim 21, further comprising a plurality of outer conductive surfaces wherein each of said at least two electrode plates and said at least one common ground conductive plate are individually and independently electrically coupled to separate outer conductive surfaces.

32. A line conditioning electronic component as recited in claim 19, wherein each of said at least two electrode plates contains a plurality of electrode patterns forming multiple sets of line-to-line and line-to-ground capacitive elements.

33. A line conditioning electronic component as recited in claim 21, wherein each of said at least two electrode plates contains a plurality of electrode patterns forming multiple sets of line-to-line and line-to-ground capacitive elements.

34. A line conditioning electronic component as recited in claim 19,
wherein said at least one common conductive plate includes at least two insulating apertures;
wherein said at least two electrode plates each include at least one insulating aperture and at least one coupling aperture; and
wherein said at least two electrode plates are positioned so each of said at least one coupling apertures is spaced apart from the other.

35. A line conditioning electronic component as recited in claim 34, further comprising at least two electrical conductors disposed through said apertures of said at least one common ground conductive plate and said at least two electrode plates, wherein each of said at least two electrical conductors is electrically coupled to a different electrode plate.

36. A line conditioning electronic component as recited in claim 34, wherein each of said at least two electrode plates contains a plurality of electrode patterns, each of said electrode patterns having at least one insulating aperture and at least one coupling aperture; and
wherein said at least one common ground conductive plate contains two insulating apertures for each of said plurality of electrode patterns.

37. A line conditioning electronic component as recited in claim 36, wherein a plurality of electrical conductors are disposed through said apertures with one pair of electrical conductors disposed through each of said electrode patterns creating at least one capacitive element between each pair of said plurality of electrical conductors and at least one capacitive element coupled between each of said electrical conductors and said at least one common ground conductive plate.

38. A line conditioning electronic component as recited in claim 37, wherein each of said electrode patterns formed on said at least two electrode plates contains at least one coupling aperture and at least two insulating apertures.

39. A line conditioning electronic component as recited in claim 19, further comprising a first differential band, a second differential band and a common band, wherein said conductive said first electrode plate is coupled to said first differential band, wherein said second electrode plate is coupled to said second differential band, and wherein said at least one common ground conductive plate is coupled to said common band creating at least one capacitive element between said first and second differential bands and at least two capacitive elements, one between said first differential band and said common band and the other between said second differential band and said common band.

40. A line conditioning electronic component as recited in claim 21, further comprising a first differential band, a second differential band and a common band, wherein said conductive said first electrode plate is coupled to said first differential band, wherein said second electrode plate is coupled to said second differential band, and wherein said at least one common ground conductive plate is coupled to said common band creating at least one capacitive element between said first and second differential bands and at least two capacitive elements, one between said first differential band and said common band and the other between said second differential band and said common band.

41. A line conditioning electronic assembly comprising:
at least two line conditioning electronic components, wherein said at least first and second line conditioning electronic components are stacked upon one another, and
wherein each of said at least two line conditioning electronic components includes:
at least one common ground conductive plate;
at least two electrode plates, wherein said first electrode plate is stacked below said common ground conductive plate and said second electrode plate is stacked above said common ground conductive plate; and
a material having predetermined electrical properties, wherein said material is maintained between said common ground conductive plate and said at least two electrode plates preventing direct electrical connection between said plates creating at least one capacitive element between said first and second electrode plates and at least two capacitive elements, one between said first electrode plate and said at least one common ground conductive plate and the other between said second electrode plate and said at least one common ground conductive plate.

42. A line conditioning electronic assembly as recited in claim 41, wherein for each line conditioning electronic component at least one common ground conductive plate is stacked below said first electrode plate and at least one common ground conductive plate is stacked above said second electrode plate, wherein said material having predetermined electrical properties is maintained between said first and second electrode plates and said common ground conductive plates.

43. A line conditioning electronic assembly as recited in claim 41, further comprising a first differential band, a second differential band and a common band, wherein said first electrode plates are coupled to said first differential band, wherein said second electrode plates are coupled to said second differential band, and wherein said common ground conductive plates are coupled to said common band creating at least one capacitive element between said first and second differential bands and at least two capacitive elements, one between said first differential band and said common band and the other between said second differential band and said common band, thereby electrically coupling said at least two line conditioning electronic components.

44. A line conditioning electronic assembly as recited in claim 42, further comprising a first differential band, a second differential band and a common band, wherein said first electrode plates are coupled to said first differential band, wherein said second electrode plates are coupled to said second differential band, and wherein said common ground conductive plates are coupled to said common band creating at least one capacitive element between said first and second differential bands and at least two capacitive elements, one between said first differential band and said common band and the other between said second differential band and said common band, thereby electrically coupling said at least two line conditioning electronic components.

* * * * *

UNITED STATES PATENT AND TRADEMARK OFFICE
CERTIFICATE OF CORRECTION

PATENT NO : 6,018,448
DATED : January 25, 2000
INVENTOR(S) : Anthony A. ANTHONY

It is certified that error appears in the above-identified patent and that said Letters Patent are hereby corrected as shown below:

Col. 31, line 6 replace "s tack ed" with --stacked--.

Col. 33, line 15 replace "and first" with --said first--.

"CLAIM 14" is cancelled without prejudice or bias.

Signed and Sealed this

Third Day of April, 2001

NICHOLAS P. GODICI

Attest:

Attesting Officer

Acting Director of the United States Patent and Trademark Office

UNITED STATES PATENT AND TRADEMARK OFFICE
CERTIFICATE OF CORRECTION

| | | |
|---|---|---|
| PATENT NO. | : 6,018,448 | Page 1 of 1 |
| APPLICATION NO. | : 09/056379 | |
| DATED | : January 25, 2000 | |
| INVENTOR(S) | : Anthony A. Anthony, William M. Anthony and Kenneth W. Musil | |

It is certified that error appears in the above-identified patent and that said Letters Patent is hereby corrected as shown below:

Title page, heading at top of page:

Under Item (12) "Anthony" should be changed to -- Anthony et al. --

Title page, Item (75):

"Inventor: Anthony A. Anthony, Erie, Pa. (US) should be changed to

-- Inventors:  Anthony A. Anthony, Erie, PA (US)
                William M. Anthony, Erie, PA (US)
                Kenneth W. Musil, Erie, PA (US) --

Signed and Sealed this
Fourteenth Day of February, 2012

David J. Kappos
*Director of the United States Patent and Trademark Office*